(12) United States Patent
Himschoot et al.

(10) Patent No.: US 12,226,997 B2
(45) Date of Patent: Feb. 18, 2025

(54) LITHOGRAPHIC PHOTOPOLYMER PRINTING PLATE PRECURSOR WITH IMPROVED DAYLIGHT STABILITY

(71) Applicant: ECO3 BV, Mortsel (BE)

(72) Inventors: Katleen Himschoot, Mortsel (BE); Eva Vermeiren, Mortsel (BE); Thomas Billiet, Mortsel (BE); Fabienne Goethals, Mortsel (BE)

(73) Assignee: ECO3 BV, Mortsel (BE)

( * ) Notice: Subject to any disclaimer, the term of this patent is extended or adjusted under 35 U.S.C. 154(b) by 23 days.

(21) Appl. No.: 18/008,541

(22) PCT Filed: May 25, 2021

(86) PCT No.: PCT/EP2021/063810
§ 371 (c)(1),
(2) Date: Dec. 6, 2022

(87) PCT Pub. No.: WO2021/249754
PCT Pub. Date: Dec. 16, 2021

(65) Prior Publication Data
US 2023/0211599 A1    Jul. 6, 2023

(30) Foreign Application Priority Data
Jun. 8, 2020  (EP) .................................... 20178729

(51) Int. Cl.
*B41C 1/10* (2006.01)
*G03F 7/031* (2006.01)
*G03F 7/09* (2006.01)
*G03F 7/30* (2006.01)

(52) U.S. Cl.
CPC ............ *B41C 1/1033* (2013.01); *G03F 7/031* (2013.01); *G03F 7/091* (2013.01); *G03F 7/3035* (2013.01); *B41C 2201/12* (2013.01); *B41C 2210/04* (2013.01)

(58) Field of Classification Search
CPC ........................................................ G03F 7/30
See application file for complete search history.

(56) References Cited

U.S. PATENT DOCUMENTS

| | | | |
|---|---|---|---|
| 6,420,089 B1 | 7/2002 | Baumann et al. | |
| 2006/0051699 A1* | 3/2006 | Baumann ................ | G03F 7/029 430/281.1 |
| 2007/0160935 A1 | 7/2007 | Okajima | |
| 2008/0280233 A1 | 11/2008 | Teng | |
| 2009/0208874 A1 | 8/2009 | Teng | |
| 2010/0009130 A1* | 1/2010 | Yu ........................... | G03F 7/091 430/273.1 |
| 2015/0177618 A1 | 6/2015 | Teng | |

FOREIGN PATENT DOCUMENTS

| | | | | |
|---|---|---|---|---|
| EP | 1788435 A1 | 5/2007 | | |
| EP | 2165829 A1 | 3/2010 | | |
| EP | 3922462 A1 * | 12/2021 | ........... | B41C 1/1016 |
| WO | WO 1996/034314 A1 | 10/1996 | | |
| WO | WO 1996/034317 A1 | 10/1996 | | |
| WO | WO 2019/076584 A1 | 4/2019 | | |

OTHER PUBLICATIONS

European Patent Office, International Search Report in International Patent Application No. PCT/EP2021/063810, mailed Sep. 7, 2021, 3 pp.
European Patent Office, Written Opinion in International Patent Application No. PCT/EP2021/063810, mailed Sep. 7, 2021, 5 pp.

* cited by examiner

*Primary Examiner* — Chanceity N Robinson
(74) *Attorney, Agent, or Firm* — Leydig, Voit & Mayer, Ltd.

(57) ABSTRACT

A lithographic printing plate precursor is disclosed which comprises a support, a photopolymerizable image recording layer and an overcoat which comprises a low-molecular radical inhibitor. After image-wise exposure, the plate is heated whereby the radical inhibitor diffuses from the overcoat to the image recording layer, resulting in an increase of the daylight stability of the exposed and heated precursor. Such plate is especially suitable for on-press processing.

18 Claims, No Drawings

LITHOGRAPHIC PHOTOPOLYMER PRINTING PLATE PRECURSOR WITH IMPROVED DAYLIGHT STABILITY

CROSS-REFERENCE TO RELATED APPLICATIONS

This patent application is the U.S. national phase of copending International Patent Application No. PCT/EP2021/063810, filed May 25, 2021, which claims the benefit of European Patent Application No. 20178729.8, filed Jun. 8, 2020.

TECHNICAL FIELD

The invention relates to a lithographic printing plate precursor which works by photopolymerization or photo-crosslinking and which has an improved daylight stability. Preferred embodiments are suitable for on-press processing.

BACKGROUND ART

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas.

Lithographic printing masters are generally obtained by the image-wise exposure and development of a so-called lithographic printing plate precursor which comprises a heat- or light-sensitive coating on a lithographic support. The exposure of the coating to heat or light, typically by means of a digitally modulated exposure device such as a laser, triggers a (physico-)chemical process in the coating, such as ablation, insolubilization by polymerization, by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or a difference in the rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas are resistant to the developer. Most lithographic plate precursors contain a hydrophobic coating on a hydrophilic support, so that the parts of the image which are resistant to the developer define the ink-accepting, hence printing areas (also called image areas) of the plate while the hydrophilic support is revealed by the dissolution of the coating in the developer at the non-printing (non-image) areas.

The coating of photopolymer plates typically comprises a negative-working image recording layer and a protective overcoat. Upon image-wise exposure to light or heat, the image recording layer undergoes a chemical reaction whereby the layer hardens, i.e. becomes insoluble or non-dispersible in the developing solution through photopolymerization and/or photocrosslinking. The overcoat protects the image recording layer from scratching or contamination. Photopolymer plates which work by free-radical polymerization or crosslinking typically contain an overcoat which also acts as an oxygen barrier layer which increases the sensitivity of the plate by reducing the quenching by oxygen of the free radicals that are generated in the image recording layer by the image-wise exposure.

Photopolymer plate precursors are typically sensitized to ultraviolet (UV) light, in particular to near-UV light in the wavelength range from 300 to 400 nm; to violet light, i.e. wavelengths ranging between 400 and 450 nm; to blue, green or red light i.e. wavelengths ranging between 450 and 750 nm; and/or to infrared (IR) light, especially near-IR light i.e. wavelengths ranging from 750 to 1500 nm.

The conventional method of making photopolymer plates comprises first an image-wise exposure step of the plate precursor with a laser, followed by a so-called "pre-heat" step to enhance the polymerization and/or crosslinking reaction of the radicals which have been generated in the image recording layer by the exposure, a wash step to remove the protective overcoat, an alkaline developing step to remove unexposed areas of the image recording layer, and a rinse and gum step. Over the past years, the market has partially evolved towards more simplified and more sustainable workflows wherein the pre-heat step and/or wash step are eliminated or wherein development and gumming are carried out in a single step. Alternatively, on-press processing wherein the plate is mounted on the press and the image is developed by interaction with the fountain and ink that are supplied to the plate during the press run, has attracted interest in the market.

Contrary to conventional plates which are processed off-press, on-press processable plates should be sufficiently resistant to daylight, otherwise the non-exposed areas of the image may harden while the plate is stored and handled until it is developed on the press. Hardening by daylight results in fogging, i.e. undesired ink uptake by the plate at the non-image areas. Several measures have been described in the prior art to increase the daylight stability, i.e. to reduce the sensitivity to daylight of the image recording layer:

- mechanically stripping off the overcoat after the image-wise exposure, as described in e.g. US2009208874;
- addition of dyes which absorb daylight in the overcoat, as described in e.g. U.S. Pat. No. 6,420,089, US20150177618 and US20070160935;
- deactivation of the image recording layer by a liquid treatment between image-wise exposure and on-press development, as described in e.g. US2009170040;
- deactivation of the image recording layer by heating or overall exposure to radiation between the image-wise exposure and on-press development, as described in US20080280233;
- addition of a blowing agent to the overcoat, which decomposes upon heating to form a gas and thereby increases the oxygen permeability of the overcoat, as described in WO 2019/076584.

WO96/34314 and WO96/34317 disclose on-press processable plates wherein the overcoat comprises a polymeric radical inhibitor, called radical quencher; since the polymer cannot diffuse to the image recording layer, only the interphase where the ingredients of the overcoat and of the image recording layer intermix, is deactivated by the polymeric radical inhibitor.

EP2165829A discloses an on-press processable plate wherein the overcoat comprises a radical inhibitor which preferably comprises a functional group capable of interacting with an inorganic stratiform compound which is also contained in the overcoat. Since the polymerization inhibitor absorbs onto the inorganic stratiform compound, photopolymerization around said compound is inhibited so as to facilitate its removal during on-press development. The interaction with the stratiform compound however prevents the radical inhibitor from diffusing into the image recording layer so that it has no impact on the daylight stability of the plate.

In summary, the known measures for reducing the daylight sensitivity of a photopolymer plate are either insufficiently effective or too cumbersome, e.g. because they produce waste or require additional equipment which is not available in a conventional plate making workflow; or they involve a liquid treatment which is contrary to the concept of a "processless" (i.e. on-press processable) plate; or they reduce also the sensitivity of the image-recording layer to the radiation that is used for the image-wise exposure.

SUMMARY OF INVENTION

It is therefore an object of the present invention to provide a lithographic plate precursor which has an improved daylight stability between image-wise exposure and processing, preferably on-press processing. It is a further object of the present invention to provide said improved daylight stability in a simple and effective way, without liquid treatment, without production of additional waste, and without substantially affecting the sensitivity of the image-recording layer before the image-wise exposure. This object is realized by the plate and method which are defined in the claims.

According to the present invention, a plate precursor is provided comprising an overcoat which includes a radical inhibitor that is capable of diffusing into the image recording layer by the application of heat. Since polymers cannot diffuse in the dry matrix of the coating of a printing plate precursor, the radical inhibitor is a low-molecular compound, i.e. an organic compound having a molecular weight of less than 1000 Dalton. The low-molecular radical inhibitor may be present in the overcoat as such or may be released in the overcoat from a polymer upon application of heat. By heating the plate precursor after the image-wise exposure, the low-molecular radical inhibitor diffuses into the image recording layer and thereby reduces its sensitivity to daylight. As a result, preferred embodiments of the invention comprise a coating wherein the non-image areas remain soluble and/or dispersible in the developer after exposure to daylight at an intensity of 500 lux for at least one hour.

According to a highly preferred embodiment of the present invention, the plate precursor comprises means for reducing the extent of intermixing of and/or premature diffusion of the radical inhibitor between the image recording layer and the overcoat. Such means include (i) adhering the inhibitor to a high-molecular compound which keeps the inhibitor in the overcoat but releases the low-molecular inhibitor upon heating; (ii) a barrier layer between the image recording layer and the overcoat; and (iii) a barrier which is incorporated into the image recording layer by adding compounds according to the following formula to the image recording layer:

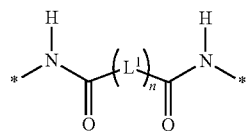

wherein n represents an integer equal to 0 or 1, $L^1$ represents a divalent linking group and * denote the linking positions to a carbon atom of the rest of the structure.

DESCRIPTION OF PREFERRED EMBODIMENTS

Definitions

The term "daylight" used herein refers to ambient white light simulated as described in the Examples.

The term "aryl" herein is preferably phenyl, benzyl, tolyl, ortho- meta- or para-xylyl, naphthyl, anthracenyl, phenanthrenyl, and/or combinations thereof. The heteroaryl group is preferably a monocyclic or polycyclic aromatic ring comprising carbon atoms and one or more heteroatoms in the ring structure, preferably 1 to 4 heteroatoms, independently selected from nitrogen, oxygen, selenium and sulfur. Preferred examples thereof include an optionally substituted furyl, pyridinyl, pyrimidyl, pyrazoyl, imidazoyl, oxazoyl, isoxazoyl, thienyl, tetrazoyl, thiazoyl, (1,2,3)triazoyl, (1,2,4)triazoyl, thiadiazoyl, thiophenyl group and/or combinations thereof. The optionally substituted heteroaryl is preferably a five- or six-membered ring substituted by one, two or three oxygen atoms, nitrogen atoms, sulfur atoms, selenium atoms or combinations thereof. Examples thereof include furan, thiophene, pyrrole, pyrazole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine or 1,2,3-triazine, benzofuran, benzothiophene, indole, indazole, benzoxazole, quinoline, quinazoline, benzimidazole or benztriazole.

The term "alkyl" herein means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl, etc. Preferably, the alkyl group is a $C_1$ to $C_{20}$-alkyl group; more preferably the alkyl group is a $C_1$ to $C_6$-alkyl group. Most preferably the alkyl is a methyl group. Cycloalkyls include for example, substituted or unsubstituted cyclopropyl, cyclopentyl, cyclohexyl, 4-methylcyclohexyl, and cyclooctyl groups.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

The optional substituents represent an alkyl, cycloalkyl, alkenyl or cycloalkenyl group, an alkynyl group, an aryl or heteroaryl group, an alkylaryl or arylalkyl group, an alkoxy group such as methoxy, ethoxy, iso-propoxy, t-butoxy, (2-hydroxytetradecyl)oxy, and various other linear and branched alkyleneoxyalkoxy groups; an aryloxy group, a thio alkyl, thio aryl or thio heteroaryl group, a hydroxyl group, —SH, a carboxylic acid group or an alkyl ester thereof, a sulfonic acid group or an alkyl est2.5er thereof, a phosphonic acid group or an alkyl ester thereof, a phosphoric acid group or an alkyl ester thereof, an amino group, a sulfonamide group, an amide group, a nitro group, a nitrile group, a halogen such as fluoro, chloro, or bromo, or a combination thereof.

A suitable alkenyl group herein is preferably a $C_2$ to $C_6$-alkenyl group such as an ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group.

A suitable alkynyl group herein is preferably a $C_2$ to $C_6$-alkynyl group; a suitable aralkyl group is preferably a phenyl group or naphthyl group including one, two, three or more $C_1$ to $C_6$-alkyl groups; a suitable aralkyl group is preferably a $C_1$ to $C_6$-alkyl group including an aryl group, preferably a phenyl group or naphthyl group.

A cyclic group or cyclic structure herein includes at least one ring structure and may be a monocyclic- or polycyclic group, meaning one or more rings fused together.

Lithographic Printing Plate Precursor

The lithographic printing plate precursor of the present invention comprises a support and provided thereon a coating which comprises an image recording layer and an overcoat. Although the overcoat is provided as a separate layer on top of the image recording layer, there may be a partial interphase wherein the ingredients of the overcoat and the image recording layer are mixed. The coating on the support may further include one or more additional layers, e.g. an undercoat layer located between the support and the image recording layer, which may be designed to increase adhesion of the printing areas of the coating onto the support and/or to facilitate the removal of the non-printing areas of the coating during processing; or a barrier layer between the image recording layer and the overcoat to avoid intermixing of ingredients of different layers during coating or to avoid diffusion of ingredients between layers during storage, which would affect the shelf life of the plate precursor.

Support

The support preferably has a hydrophilic surface or is provided with a hydrophilic layer. Most preferred is a grained and anodized aluminum support, well known in the art. Suitable supports are for example disclosed in EP1843203 (paragraphs to [0075]). The surface roughness obtained after the graining step, expressed as arithmetical mean center-line roughness Ra (ISO 4287/1 or DIN 4762), may vary between 0.05 and 1.5 µm. The aluminum substrate has preferably an Ra value below 0.50 µm, more preferably below 0.40 µm and most preferably below 0.30 µm. The lower limit of the Ra value is preferably about 0.1 µm. By anodizing the aluminum support, an $Al_2O_3$ layer is formed of which the weight (g/m² $Al_2O_3$) may vary between 1 and 8 g/m², more preferably between 2 and 3 g/m².

The grained and anodized aluminum support may be subjected to a so-called post-anodic treatment and/or a pore widening treatment. Suitable examples of post-anodic treatment are treatments with poly(vinylphosphonic acid) or derivatives thereof, with poly(acrylic acid), with potassium fluorozirconate or a phosphate, with an alkali metal silicate, or combinations thereof. Alternatively, the support may be treated with an adhesion promoting compound such as those described in EP1788434 in [0010] and in WO 2013/182328.

Besides an aluminum support, a plastic support, for example a polyester support, provided with one or more hydrophilic layers as disclosed in for example EP 1025992 may also be used.

Image Recording Layer

The image recording layer is negative-working, i.e. the unexposed image recording layer is soluble or dispersible in a suitable developer while the exposed image recording layer becomes resistant to the developer due to hardening induced by the exposure. Preferred embodiments are suitable for on-press development and comprise an image recording layer which can be removed completely from the support by interaction with the ink and/or fountain at the start of the press run and which becomes resistant to ink and fountain by the exposure.

The hardening of the image recording layer upon exposure is produced by a photopolymerizable and/or photocrosslinkable composition which is sensitized to (ultra) violet or infrared light. The peak sensitivity of the composition may be above 420 nm, but a better daylight stability can be obtained with compositions that have their peak sensitivity at shorter wavelength, preferably below 420 nm and more preferably below 410 nm. The availability of laser diodes emitting in the near UV wavelength range, e.g. at 365 or 375 nm, makes compositions having a peak sensitivity outside the visible wavelength range, i.e. below 400 nm, particularly advantageous. According to another embodiment, the peak sensitivity of the composition is in the IR wavelength range, preferably near-IR light having a wavelength from 750 to 1100 nm, and more preferably from 780 to 850 nm.

The image recording layer preferably has a coating thickness between 0.2 and 5.0 g/m², more preferably between 0.4 and 3.0 g/m² and most preferably between 0.6 and 1.5 g/m².

Polymerizable or Crosslinkable Composition

A preferred photopolymerizable or photocrosslinkable composition includes a polymerizable or crosslinkable compound, an initiator, an (ultra)violet sensitizer and/or infrared sensitizer, and a polymeric binder.

The polymerizable or crosslinkable compound is preferably a monomer or oligomer including at least one terminal ethylenic group, hereinafter also referred to as "free-radical polymerizable monomer", and the polymerization initiator is a compound capable of generating free radicals upon exposure, optionally in the presence of a sensitizer (hereinafter said initiator is referred to as "free-radical initiator").

Suitable free-radical polymerizable monomers include, for example, multifunctional (meth)acrylate monomers such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have another double bond or epoxide group in addition to the (meth)acrylate group. The (meth)acrylate monomers may also contain an acidic (such as carboxylic acid) or basic (such as amine) group. Suitable free-radical polymerizable monomers are disclosed in [0042] and [0050] of EP2916171 and are incorporated herein by reference.

Suitable free-radical initiators are described in WO2005/111727 from page 15 line 17 to page 16 line 11 and in EP1091247. Preferred free-radical initiators are for example hexaaryl-bisimidazole compound (HABI; dimer of triarylimidazole), aromatic ketones, organic peroxides, thio compounds, keto-oxime ester compounds, borate compounds, azinium compounds, metallocene compounds, active ester compounds and compounds having a carbon-halogen bond.

A preferred free-radical initiator is an optionally substituted trihaloalkyl sulfone compound (referred to hereafter as "THS" compound) wherein halo independently represents bromo, chloro or iodo and sulfone is a chemical compound containing a sulfonyl group (—$SO_2$—) attached to two carbon atoms. More preferably, the THS compound is an optionally substituted trihaloalkyl-(hetero)aryl sulfone, i.e. a compound wherein the sulfonyl group is attached to an optionally substituted trihaloalkyl group and to an optionally substituted aryl or optionally substituted heteroaryl group. The aryl group is preferably an optionally substituted phenyl, benzyl, tolyl or an ortho- meta- or para-xylyl, naphthyl, anthracenyl, phenanthrenyl, and/or combinations thereof. The heteroaryl group is preferably an optionally substituted monocyclic or polycyclic aromatic ring comprising carbon atoms and one or more heteroatoms in the ring structure, preferably 1 to 4 heteroatoms independently selected from nitrogen, oxygen, selenium and sulfur. Preferred examples thereof include furan, thiophene, pyrrole, pyrazole, imidazole, 1,2,3- or 1,2,4-triazole, tetrazole, oxazole, isoxazole, thiazole, isothiazole, thiadiazole, oxadiazole, pyridine, pyridazine, pyrimidine, pyrazine, 1,3,5-, 1,2,4- or 1,2,3-triazine, benzofuran, benzothiophene, indole, indazole, benzoxazole, quinoline, quinazoline, benzimidazole or benztriazole. The most preferred THS compound is an optionally substituted tribromomethyl-aryl sulfone, most preferably an optionally substituted tribromomethyl-phenyl sulfone.

The amount of the THS-initiator typically ranges from 0.1 to 30 wt. %, preferably from 0.5 to 10 wt. %, most preferably from 2 to 7 wt. % relative to the total dry weight of the non-volatile components of the photopolymerizable or photocrosslinkable composition.

Another group of preferred free-radical initiators are onium salts, in particular iodonium salts and sulfonium salts or mixtures thereof. Suitable classes of iodonium salts are optionally substituted diaryl iodonium salts or diheteroaryl iodonium salts. Specific examples of the diaryliodonium salts include diphenyliodonium, 4-methoxyphenyl-4-(2-methylpropyl) phenyliodonium, 4-chlorophenyl-4-phenyliodonium, 4-(2-methylpropyl) phenyl-tolyl iodonium, 4-hexyloxyphenyl-2,4,6-trimethoxyphenyliodonium, 4-hexyloxyphenyl-2,4-diethoxyphenyliodonium, 4-octyloxyphenyl-6-trimethoxyphenyliodonium, bis (4-tert-butylphenyl) iodonium and bis (4-isopropylphenyl) iodonium, 4-octyloxyphenyl phenyliodonium, [4-[(2-hydroxytetradecyl)-oxy]phenyl]phenyliodonium, 4-methylphenyl-4'-hexylphenyliodonium tetraphenylborate, 4-methylphenyl-4'-cyclohexylphenyliodonium, 4-hexylphenyl-phenyliodonium, 4-methylphenyl-4'cyclohexylphenyliodonium, 4-cyclohexylphenyl-phenyliodonium, 2-methyl-4-t-butylphenyl4¹-methylphenyliodonium.

Preferred examples of the triarylsulfonium salts include triphenylsulfonium, dialkylphenacylsulfonium, dialkyl-4-hydroxyphenylsulfonium, bis (4-chlorophenyl) phenylsulfonium, triphenylsulfonium benzoyl formate, bis (4-chlorophenyl) phenylsulfonium benzoyl formate, bis (4-chlorophenyl)-4-methylphenylsulfonium bis (4-chlorophenyl)-4-methylphenylsulfonium, tris (4-chlorophenyl) sulfonium, tris 2,4-dichlorophenyl) sulfonium, bis (2,4-dichlorophenyl) phenyl sulfonium and bis (2,4-dichlorophenyl) 4-methoxyphenyl sulfonium.

Suitable counter ions of the onium salts are for example $PF_6^-$, $SbF_6^-$, $AsF_6^-$, $Ph_4B^-$. The onium salts are preferably present in the coating in an amount between 1 and 25 wt. %, more preferably in an amount between 5 and 20 wt. %, and most preferably in an amount between 10% and 16 wt. %, all based on the total dry weight of the photopolymerizable and/or photocrosslinkable layer.

The image recording layer may also comprise a co-initiator which is used in combination with a free-radical initiator. Suitable co-initiators for use in the photopolymer coating are disclosed in U.S. Pat. Nos. 6,410,205; 5,049,479; EP1079276, EP107792, EP1369232, EP1369231, EP1341040, US2003/0124460, EP1241002, EP1288720 and in the reference book including the cited references: Chemistry & Technology UV & EB formulation for coatings, inks & paints—Volume 3—Photoinitiators for Free Radical and Cationic Polymerization by K. K. Dietliker—Edited by P. K. T. Oldring (1991; ISBN 0947798161). Preferred co-initiators are disclosed in EP2916171 (par. [0051]) and are incorporated herein by reference.

Suitable (ultra)violet sensitizers are dyes having a light absorption peak in the wavelength range from 320 nm to 500 nm, preferably from 350 to 450 nm and more preferably from 360 to 420 nm. Suitable (near-)infrared sensitizers are dyes having a light absorption peak in the wavelength range from 750 to 1100 nm, preferably from 780 to 850 nm and more preferably from 810 to 830 nm. The best daylight stability is achieved with sensitizers that have an absorption peak below 400 nm and/or above 750 nm. The mentioned absorption peak wavelengths are values as measured in the dry matrix of the coating of the plate precursor.

Suitable (ultra)violet sensitizers are e.g. fluorenes, thioxanthones, (keto-)coumarines, pyrilium or thiopyrilium dyes. More preferred dyes have the general structure Sty-Ar-Sty wherein each "Sty" group is an optionally substituted styryl ($C_6H_5$—CH=CH—) group and Ar is an optionally substituted aromatic or an optionally substituted heteroaromatic group which forms a conjugated system with the Sty groups. The two Sty groups may be the same of different. Examples of Ar are preferably derived from benzene, naphthalene, anthracene, fluorene, biphenyl, carbazole, furan, dibenzofuran, thiophene, dibenzothiophene, dithienothiophene, oxadiazole, thiadiazole, pyridine, pyrimidine and combinations of two or more of these groups which may be the same or different. Dyes wherein Ar is biphenyl or phenyl are the most preferred, and these dyes will be referred to herein as distyryl-biphenyl compounds and distyryl-benzene compounds respectively.

Highly preferred (ultra)violet sensitizers are distyryl-biphenyl compounds and distyryl-benzene compounds having a structure according to the following Formula's UV-I and UV-II respectively:

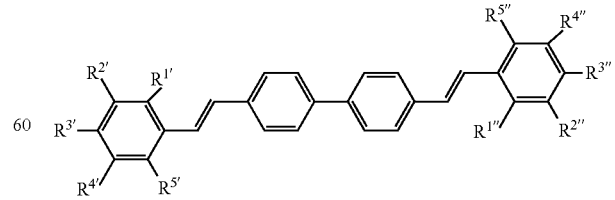

Formula UV-I wherein $R^{1'}$ to $R^{5'}$ and $R^{1''}$ to $R^{5''}$ independently represent hydrogen, an alkyl group, an alkoxy group, a cyano group or a halogen;

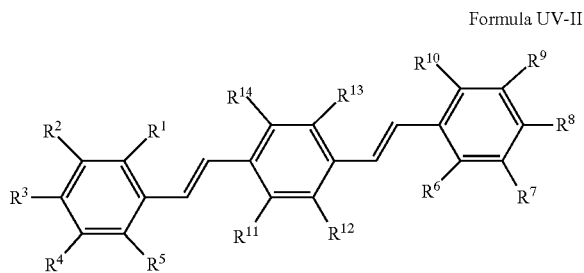

Formula UV-II wherein $R^1$ to $R^{14}$ independently represent hydrogen, an alkyl group, an alkoxy group, a cyano group or a halogen.

One of $R^{1'}$ to $R^{5'}$ or $R^{1'''}$ to $R^{5'''}$ in Formula UV-I preferably represents an alkoxy group having more than 1 carbon atom.

More preferably, $R^{1'}$, $R^{5'}$, $R^{1'''}$, $R^{5'''}$ in Formula UV-I independently represent hydrogen, fluorine, chlorine, $R^{2'}$ to $R^{4'}$ and $R^{2'''}$ to $R^{4'''}$ in Formula UV-I independently represent an alkoxy group; and at least two of the alkoxy groups are branched and have from 3 to 15 carbon atoms.

Even more preferred, $R^{1'}$, $R^{5'}$, $R^{1'''}$, $R^{5'''}$ in Formula UV-I represent hydrogen and $R^{2'}$ to $R^{4'}$ and $R^{2'''}$ to $R^{4'''}$ in Formula UV-I independently represent an alkoxy group; and at least two of the alkoxy groups are branched and have from 3 to 15 carbon atoms.

Most preferred, $R^{2'}$, $R^{4'}$, $R^{2'''}$, $R^{4'''}$ in Formula UV-I represent a methoxy group and $R^{3'}$ and $R^{3'''}$ in Formula UV-I independently represent branched alkoxy groups having 3 to 15 carbon atoms.

One of $R^1$ to $R^{10}$ in Formula UV-II preferably represents an alkoxy group having more than 1 carbon atom.

More preferably, $R^1$, $R^5$, $R^6$, $R^{10}$, $R^{11}$, $R^{12}$, $R^{13}$ and $R^{14}$ in Formula UV-II independently represent hydrogen, fluorine, chlorine, $R^2$ to $R^4$ and $R^7$ to $R^9$ in Formula UV-II independently represent an alkoxy group; and at least two of the alkoxy groups are branched and have from 3 to 15 carbon atoms.

Even more preferred, $R^1$, $R^5$, $R^6$, and $R^{10}$ in Formula UV-II represent hydrogen and $R^2$ to $R^4$, and $R^7$ to $R^9$ in Formula UV-II independently represent an alkoxy group; and at least two of the alkoxy groups are branched and have from 3 to 15 carbon atoms.

Most preferred, $R^2$, $R^4$, $R^7$ and $R^9$ in Formula UV-II represent a methoxy group and $R^3$ and $R^8$ in Formula UV-II independently represent branched alkoxy groups having 3 to 15 carbon atoms.

The following compounds are examples of highly preferred sensitizers according to Formula UV-I or UV-II:

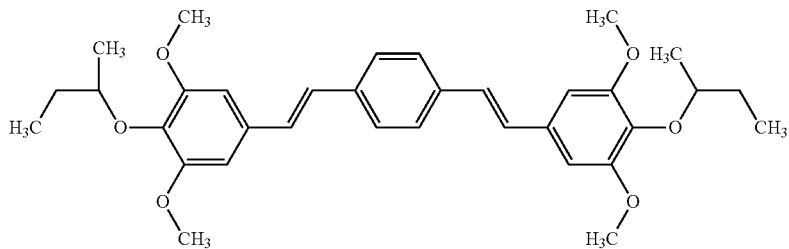

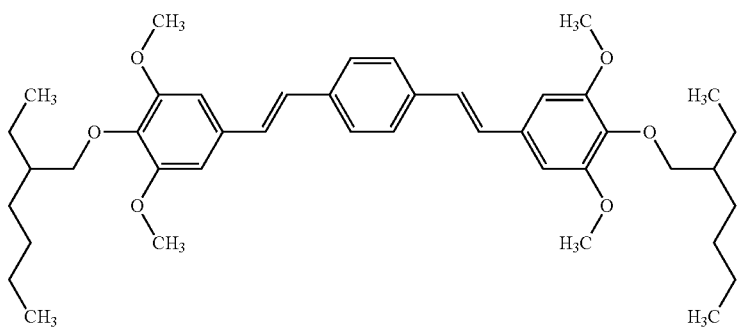

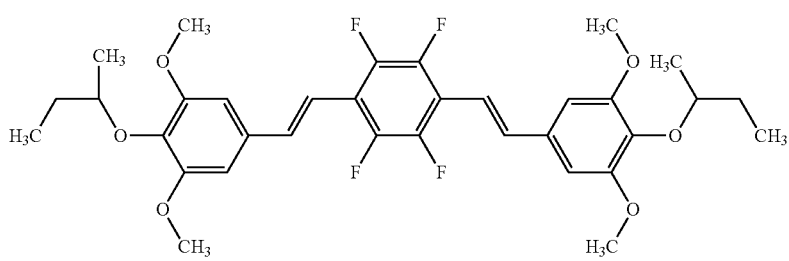

-continued
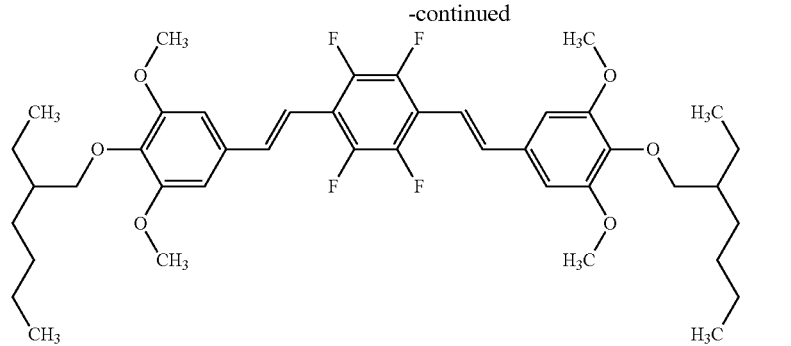
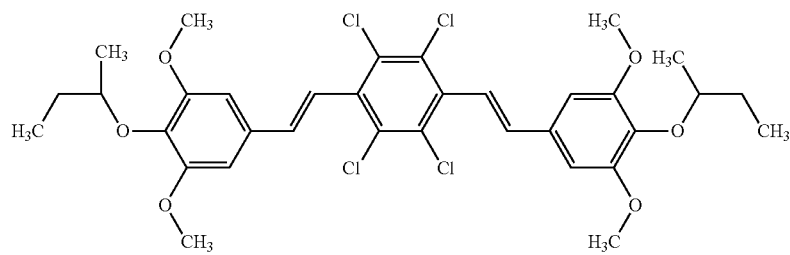
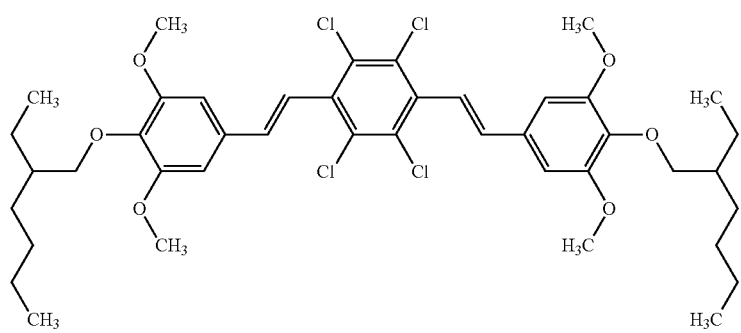
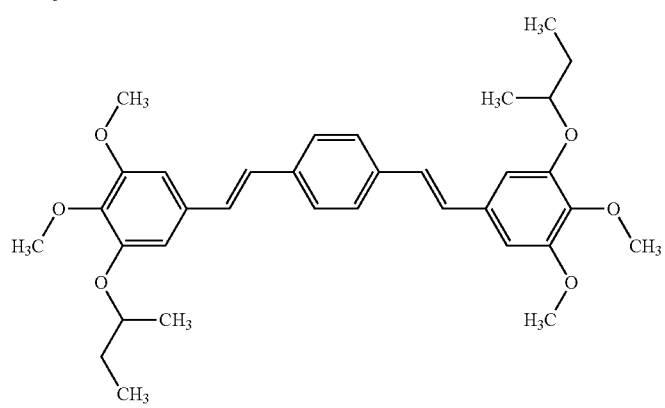
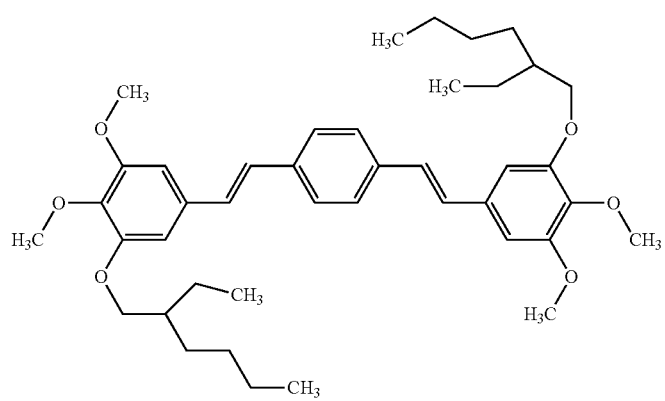

-continued

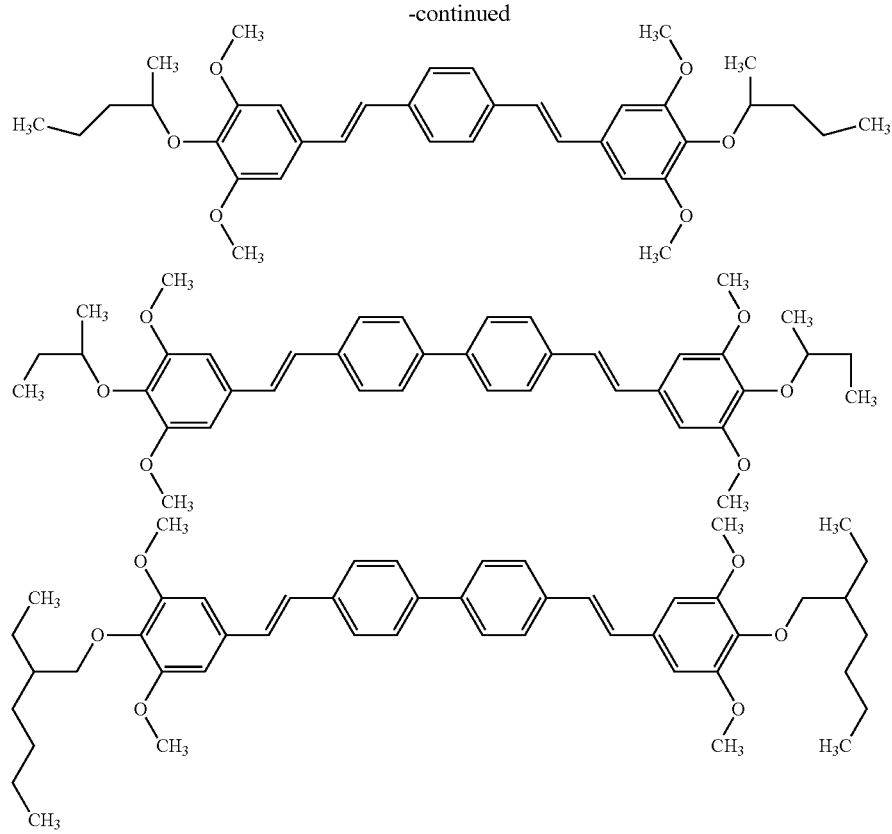

The overall amount of the (ultra)violet sensitizer(s) is preferably comprised between 0.1 and 25 wt. %, more preferably between 0.5 and 20 wt. % and most preferably between 1.0 and 15 wt. % with respect to the total dry weight of the image recording layer.

Suitable near-IR sensitizers include IR light absorbing dyes and pigments. A preferred pigment is carbon black. A preferred IR-dye has a light absorption peak between 750 nm and 1300 nm, more preferably between 780 nm and 1100 nm, and most preferably between 800 nm and 850 nm. Suitable IR-dyes are merocyanines, indoanilines, oxonoles, pyrilium dyes, squarilium dyes and cyanine dyes, in particular heptamethine cyanine dyes. Examples of suitable IR-dyes are described in e.g. EP823327, EP978376, EP1029667, EP1053868, EP1093934; EP1359008; WO97/39894 and WO00/29214. Highly preferred IR-dyes produce a visible image immediately upon the image-wise exposure, e.g. those disclosed in EP1736312, EP1910082 and WO2019/219560. Such thermochromic IR-dyes can also be used in the overcoat.

Also mixtures of sensitizers can be used, e.g. mixtures of two or more of the above mentioned dyes, or mixtures of the above dyes with other sensitizers. The overall concentration of the sensitizer(s) with respect to the total dry weight of the image recording layer is preferably from 0.25 to 25.0 wt. %, more preferably from 0.5 to 20.0 wt. % and most preferably from 1.0 to 10.0 wt. %.

The binder can be selected from a wide series of organic polymers. Mixtures of different binders can also be used. Useful binders are described in WO2005/111727 page 17 line 21 to page 19 line 30, EP1043627 in paragraph [0013] and in WO2005/029187 page 16 line 26 to page 18 line 11.

The image recording layer may also comprise additional ingredients, such as leuco dyes which form a visible image upon the image-wise exposure, particles which protect the layer from mechanical damage, an adhesion promoting compound, and even small amounts of a radical inhibitor which may be the same as or different from the one in the overcoat. Various surfactants may also be added to the image recording layer to allow or enhance the developability thereof.

The mentioned particles that protect the layer from mechanical damage, such as scratches due to manual handling or plate handling equipment, may be inorganic particles, organic particles or fillers such as described in for example U.S. Pat. No. 7,108,956. More details of suitable spacer particles described in EP2916171A [0053] to [0056] are incorporated herein by reference.

The adhesion promoting compound is a compound capable of interacting with the support, preferably a compound having an addition-polymerizable ethylenically unsaturated bond and a functional group capable of interacting with the support. Under "interacting" is understood each type of physical and/or chemical reaction or process whereby, between the functional group and the support, a bond is formed which can be a covalent bond, an ionic bond, a complex bond, a coordinate bond or a hydrogen-bond, and which can be formed by an adsorption process, a chemical reaction, an acid-base reaction, a complex-forming reaction or a reaction of a chelating group or a ligand.

The adhesion promoting compound may be selected from at least one of the low molecular weight compounds or polymeric compounds as described in EP851299A from lines 22 on page 3 to line 1 on page 4, EP1500498A from paragraph [0023] on page 7 to paragraph [0052] on page 20, EP1495866A paragraph [0030] on page 5 to paragraph [0049] on page 11, EP1091251A from paragraph [0014] on page 3 to paragraph [0018] on page 20, and EP1520694A from paragraph [0023] on page 6 to paragraph [0060] on page 19. Preferred compounds are those compounds which comprise a phosphate or phosphonate group as functional group capable of adsorbing on the aluminum support and which comprise an addition-polymerizable ethylenic double bond reactive group, especially those described in EP851299A from lines 22 on page 3 to line 1 on page 4 and EP1500498A from paragraph [0023] on page 7 to paragraph [0052] on page 20. Also preferred are those compounds which comprises a tri-alkyl-oxy silane groups, hereinafter also referred to as "trialkoxy silane" groups, wherein the alkyl is preferably methyl or ethyl, or wherein the trialkyloxy silane groups are at least partially hydrolyzed to silanol groups, as functional group capable of adsorbing on the support, especially silane coupling agents having an addition-polymerizable ethylenic double bond reactive group as described in EP1557262A paragraph [0279] on page 49 and EP1495866A paragraph [0030] on page 5 to paragraph [0049] on page 11. Also the adhesion promoting compounds described in EP2916171A [0058] are incorporated herein by reference.

The adhesion promoting compound may be present in the image recording layer in an amount ranging between 1 and 50 wt. %, preferably between 3 and 30 wt. %, more preferably between 5 and 20 wt. % of the dry weight of the layer.

The adhesion promoting compound may be present in an optional intermediate layer (undercoat) in an amount of at least 25 wt. %, preferably at least 50 wt. %, more preferably at least 75 wt. %, of the dry weight of the layer. Alternatively, the intermediate layer may consist entirely of the adhesion promoting compound.

In a highly preferred embodiment, the image recording layer further comprises means for reducing the extent of intermixing between the image recording layer and the overcoat or for reducing the extent of premature (i.e. before the heating step) diffusion of the low-molecular radical inhibitor from the overcoat to the image recording layer. Such means are described in a separate section below.

Overcoat

The overcoat is preferably soluble or dispersible in water so that it can be removed easily by an aqueous developer or by the fountain during on-press development. As a result, the overcoat preferably comprises a hydrophilic binder. Preferred binders which can be used in the top layer are disclosed in WO2005/029190 (page 36 line 3 to page 39 line 25), US 2007/0020563 (paragraph [0158]) and EP1288720A (paragraphs [0148] and [0149]), including the references cited in these patent applications.

The most preferred binder of the overcoat is poly(vinyl alcohol) and/or derivatives of poly(vinyl alcohol). The poly (vinyl alcohol) has preferably a hydrolysis degree ranging between 74 mole % and 99 mole %, more preferably between 88 mole % and 98 mole %. The viscosity number of the poly(vinyl alcohol), which is related to the molecular weight and is measured as a 4 wt. % aqueous solution at 20° C. in accordance with DIN 53015, preferably ranges between 1 and 26, more preferably between 2 and 15, and most preferably between 2 and 10.

A mixture of hydrophilic binders may also be used, for example a mixture of two or more water-soluble polymers such as a combination of poly(vinyl alcohol) and poly(vinyl pyrrolidone), or a mixture of poly(vinyl alcohol)s and/or derivatives of poly(vinyl alcohol)s having a different hydrolysis and viscosity number. Modified poly(vinyl alcohol), e.g. poly(vinyl alcohol) having a carboxyl group and/or a sulfonic acid group may also be used, preferably together with unmodified poly(vinyl alcohol).

The coating thickness of the overcoat is preferably between 0.15 and 1.75 g/m$^2$, more preferably between 0.20 and 1.3 g/m$^2$, and most preferably between 0.25 and 1.0 g/m$^2$. After applying the overcoat, the wet layer is dried at a moderate temperature, preferably less than 100° C., more preferably less than 80° C. and most preferably less than 60° C. A high drying temperature may induce diffusion of the radical inhibitor to the image recording layer and is therefore preferably avoided.

In addition to the radical inhibitor described below, the overcoat may comprise other ingredients such as anionic surfactants, e.g. sodium alkyl sulfate or sodium alkyl sulfonate, sodium dioctylsulfosuccinate, sodium dodecylbenzenesulfonate, and ammoniumlaurylsulfate; amphoteric surfactants, e.g. alkylaminocarboxylate and alkylamino-dicarboxylate; non-ionic surfactants, e.g. polyethylene glycol, polypropylene glycol, and copolymer of ethylene glycol and propylene glycol, polysiloxane surfactants, perfluorocarbon surfactants, alkylphenyl ethylene oxide condensate, alkoxylated alkylene diamines disclosed in EP1085380A (paragraph [0021] and [0022]); and various additives such as glycerine, pigments, matting agents or wetting agents as disclosed in EP2916171A, and/or (in)organic acids, e.g. the acids disclosed in EP2149071A page 27 lines 1 to 21. Also microparticles may be added to the overcoat, for example to reduce the tackiness or moisture sensitivity of the plate.

In a highly preferred embodiment of the present invention, the overcoat further comprises a thermochromic dye which produces a visible image upon image-wise exposure with IR light, as disclosed in WO2019/219560.

Low-Molecular Radical Inhibitor

According to the present invention, the overcoat further comprises a radical inhibitor, which is preferably water-soluble because the overcoat is typically applied from an aqueous coating solution. Mixtures of water and an organic solvent, e.g. an alcohol, can also be used to improve the solubility of the radical inhibitor. Poorly soluble inhibitors can also be added as a dispersion to the coating solution of the overcoat.

The radical inhibitor is a low-molecular compound, i.e. an organic compound having a molecular weight of less than 1000 Dalton. The low-molecular radical inhibitor can be added as such to the overcoat or can be a component of a high-molecular compound which releases the low-molecular radical inhibitor upon heating. In both embodiments, the low-molecular radical inhibitor is capable of diffusing from the overcoat to the image recording layer, whereby the daylight sensitivity of the image recording layer is reduced, preferably to such an extent that it can tolerate daylight at an intensity of 500 lux for at least one hour without fogging. More preferred embodiments show a reduction of the daylight sensitivity so that the image recording layer can tolerate daylight at an intensity of 500 lux for at least 2 hours without fogging, even more preferably at least 4 hours and most preferably at least 12 hours.

Many radical inhibitors which are suitable for use in the present invention, have been described in the prior art as a component of the image recording layer wherein it is added to improve the shelf life (i.e. storage before use) of the plate precursor. Typical inhibitors comprise a radical trapping group which is capable of deactivating the radicals that are generated in the image recording layer by exposure to light. Polyfunctional inhibitors which comprise two or more radical trapping groups can also be used. Suitable trapping groups are e.g. oxime, phenol, nitro, nitroxyl, nitroso, nitrone, hydroxamix acid and amidoxime.

Specific examples of the radical inhibitor for use in the present invention include quinones or quinone methides, for example a substituted or unsubstituted benzoquinone; phenolic compounds, for example a substituted or unsubstituted phenol or hydroquinone; amino compounds, for example N,N'-tetraethyl-p-phenylenediamine; sulfur compounds, for example a tetraalkylthiourea disulfide; N-oxides, for example a substituted or unsubstituted pyridine-N-oxide; thiocyanates, for example ammonium thiocyanate; nitrites, for example sodium nitrite; phenothiazines; nitro or nitroso compounds; 2-mercaptobenzothiazoles; 2-mercaptobenzoxazoles; and 2-mercaptobenzimidazoles.

Preferred radical inhibitors for use in the present invention are nitroxyl compounds, i.e. compounds comprising the free radical group >N—O·, such as the compounds disclosed in EP0828195A and WO2006/024621. The more preferred radical inhibitors contain a sterically hindered nitroxyl group such as:

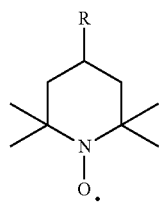

wherein R is a substituent.

Specific examples thereof are the following:
di-tert-butyl nitroxyl,
1-oxyl-2,2,6,6-tetramethylpiperidine,
1-oxyl-2,2,6,6-tetramethylpiperidin-4-ol,
1-oxyl-2,2,6,6-tetramethylpiperidin-4-one,
1-oxyl-2,2,6,6-tetramethylpiperidin-4-yl acetate,
1-oxyl-2,2,6,6-tetramethylpiperidin-4-yl 2-ethylhexanoate,
1-oxyl-2,2,6,6-tetramethylpiperidin-4-yl stearate,
1-oxyl-2,2,6,6-tetramethylpiperidin-4-yl benzoate,
1-oxyl-2,2,6,6-tetramethylpiperidin-4-yl 4-tert-butylbenzoate,
bis(1-oxyl-2,2,6,6-tetramethylpiperidin-4-yl) succinate,
bis(1-oxyl-2,2,6,6-tetramethylpiperidin-4-yl) adipate,
bis(1-oxyl-2,2,6,6-tetramethylpiperidin-4-yl) sebacate,
bis(1-oxyl-2,2,6,6-tetramethylpiperidin-4-yl) n-butylmalonate,
bis(1-oxyl-2,2,6,6-tetramethylpiperidin-4-yl) phthalate,
bis(1-oxyl-2,2,6,6-tetramethylpiperidin-4-yl) isophthalate,
bis(1-oxyl-2,2,6,6-tetramethylpiperidin-4-yl) terephthalate,
bis(1-oxyl-2,2,6,6-tetramethylpiperidin-4-yl) hexahydroterephthalate,
N,N'-bis(1-oxyl-2,2,6,6-tetramethylpiperidin-4-yl)adipamide,
N-(1-oxyl-2,2,6,6-tetramethylpiperidin-4-yl)-caprolactam,
N-(1-oxyl-2,2,6,6-tetramethylpiperidin-4-yl)-dodecylsuccinimide,
2,4,6-tris(1-oxyl-2,2,6,6-tetramethylpiperidin-4-yl isocyanurate,
2,4,6-tris-[N-butyl-N-(1-oxyl-2,2,6,6-tetramethylpipeddin-4-yl]-s-triazine, or
4,4'-ethylenebis(1-oxyl-2,2,6,6-tetramethylpiperazin-3-one).

Highly preferred inhibitors are bis(1-oxyl-2,2,6,6-tetramethyl-piperidin-4-yl) sebacate (referred to hereafter as "Compound A"), 4-benzylidene-2,6-di-tert-butyl-cydohexa-2,5-dienone and 1-oxyl-2,2,6,6-tetramethyl-4-hydroxypiperidine.

Since the radical inhibitor diffuses into the image recording layer upon heating after the image-wise exposure, it can be added to the overcoat layer in a much higher concentration than when it would be added directly in the image recording layer. The prior art discloses very low concentrations of the radical inhibitor when it is added directly to the image recording layer: typically less than 1 wt. % relative to the image recording layer as a whole, more preferably less than 0.2 wt. %. Since a typical image recording layer has a coating weight of about 1 g/m², the amount of radical inhibitor used in the prior art is generally less than 10 mg/m². In the present invention however, the low-molecular radical inhibitor may be added (or released by the heating, as described in more detail below) in the overcoat layer at a higher concentration than 10 mg/m², preferably at least 20 mg/m², more preferably at least 40 mg/m². Some embodiments may even produce good results at an amount of the radical inhibitor higher than 60 mg/m². When such high amounts would be used in the image recording layer, its sensitivity to the light used for the image-wise exposure would be far too low and the material would have no practical use.

Means for Reducing the Extent of Intermixing of and/or Premature Diffusion Between the Image Recording Layer and the Overcoat In preferred embodiments of the present invention, the plate precursor comprises means for reducing the extent of intermixing of the ingredients of the image recording layer and the overcoat during coating and/or means for reducing the extent of premature diffusion (i.e. migration before the heating step) of the radical inhibitor from the overcoat to the image recording layer during storage. Both effects result in a lower sensitivity of the image recording layer to the light that is used for the image-wise exposure, due to the presence of the radical inhibitor in the photopolymerizable and/or photocrosslinkable composition of the image recording layer.

The extent of intermixing and/or premature diffusion is dependent on various factors. When the image recording layer and the overcoat are applied as solutions in immiscible solvent systems (e.g. the recording layer is coated from an organic solvent or a mixture of organic solvents, and the overcoat from an aqueous solution), the extent of intermixing is expected to be lower than when the layers are coated from similar solvent systems. Premature diffusion after coating may also depend on the type of binder in the layers or the presence of fillers such as inorganic particles which may hinder diffusion of components.

One way to achieve less intermixing and/or premature diffusion involves the application of the overcoat separately on a temporary support, e.g. a plastic support provided with a release layer, and then laminating the dry overcoat on top of the dry image recording layer and peeling off the temporary support. A barrier layer can also be coated on the image recording layer before applying the overcoat. Such barrier layer may in principle have any composition as long as it dissolves well in the developer, since it mainly acts as a spacer between the image recording layer and the overcoat. Both embodiments can also be combined by coating the overcoat and the barrier layer on a temporary support, laminating that material to the image recording layer so that the barrier layer is between the image recording layer and the overcoat and then peeling off the temporary support.

In preferred embodiments the extent of intermixing or premature diffusion can be reduced by adding compounds according to the following Formula I to the image recording layer:

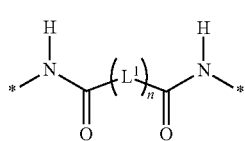
(Formula I)

wherein n represents an integer equal to 0 or 1, $L^1$ represents a divalent linking group and * denote the linking positions to a carbon atom of the rest of the structure.

Compounds of Formula I will be referred to herein as "barrier compound(s)" because they act as a barrier against intermixing and diffusion that is integrated in the image recording layer. The synthesis of these compounds has been described in WO2014/198820 and WO2014/198823. The amount of the barrier compound in the image recording layer is preferably higher than 1 wt. %, more preferably higher than 2 wt. % and most preferably higher than 5 wt. % relative to the total weight of all ingredients in the photopolymerizable layer. The amount is preferably less than 50 wt. %, more preferably between 8 and 40 wt. %, and most preferably between 10 and 20 wt. % relative to the total weight of all ingredients in the photopolymerizable layer.

The barrier compound can be a monomer, an oligomer (i.e. a structure including a limited amount of monomers such as two, three or four repeating units) or a polymer (i.e. a structure including more than four repeating units). The barrier compound contains at least one moiety according to Formula I, preferably 2 to 150 moieties according to Formula I, more preferably 2 to 100 moieties according to Formula I and most preferably 2, 3 or 4 moieties according to Formula I.

The divalent linking group $L^1$ in Formula I is preferably selected from an optionally substituted alkylene, cycloalkylene, arylene, or heteroarylene, —O—, —CO—, —CO—O—, —O—CO—, —CO—NH—, —NH—CO—, —NH—CO—O—, —O—CO—NH—, —NH—CO—NH—, —NH—CS—NH—, —CO—NR'—, —NR"—CO—, —NH—CS—NH—, —SO—, —SO2-, —SO2-NH—, —NH—SO2-, —CH=N—, —NH—NH—, —N+(CH3)2, —S—, —S—S—, and/or combinations thereof, wherein R' and R" each independently represent an optionally substituted alkyl, aryl, or heteroaryl. The substituents optionally present on the alkylene, the arylene or the heteroarylene group may be represented by an alkyl group such as a methyl, ethyl, propyl or isopropyl group, substituents including for example oxygen or sulfur; a halogen such as a fluorine, chlorine, bromine or iodine atom; a hydroxyl group; an amino group; an alkoxy group such as a methoxy or ethoxy group or a (di)alkylamino group.

More preferably, the divalent linking group $L^1$ is a divalent aliphatic group including straight or branched carbon chain(s) or alicyclic, non-aromatic ring(s). Optionally the aliphatic linking group may contain substituents including for example oxygen or sulfur; alkyl groups such as a methyl, ethyl, propyl or isopropyl group and halogens such as a fluorine, chlorine, bromine or iodine atom. Most preferably, the linking group $L^1$ represents an optionally substituted alkylene or cycloalkylene group. The substituents optionally present on the alkylene or cycloalkylene group may be represented by an alkyl group such as a methyl, ethyl, propyl or isopropyl group or a halogen such as a fluorine, chlorine, bromine or iodine atom.

Preferred barrier compounds are represented by Formula II:

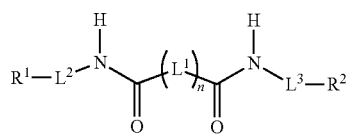
(Formula II)

wherein $R^1$ and $R^2$ independently represent a group including a free radical polymerizable group; n represents an integer equal to 0 or 1; $L^2$ and $L^3$ independently represent a divalent linking group; and $L^1$ has the same meaning as in Formula I.

The free radical polymerizable groups in $R^1$ and $R^2$ may be the same or different. Suitable examples are acrylate, methacrylate, acrylamide, methacrylamide, styryl or vinyl, which may each be substituted. An acrylate and methacrylate group are particularly preferred. The optional substituents are e.g. a halogen such as a fluorine, chlorine, bromine or iodine atom or an alkyl group such as a methyl, ethyl, propyl or isopropyl group.

The linking groups $L^2$ and $L^3$ preferably independently represent a group as defined above for $L^1$. Preferably, the linking group $L^1$ of Formula I and II does not contain a tertiary amine group because these groups are often responsible for staining on the plate in the non-image areas after processing. Compounds including a linking group $L^1$ containing an aromatic ring structure may be of less interest because they have a limited solubility in the photopolymer coating solution.

Highly preferred barrier compounds are oxamide derivatives, i.e. compounds according to Formula I or II wherein n=0. In a most preferred embodiment the oxamide derivative is presented by Formula III:

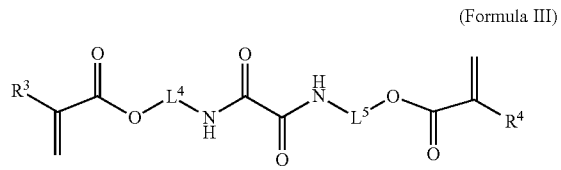
(Formula III)

wherein $R^3$ and $R^4$ independently represent a terminal group and $L^4$ and $L^5$ independently represent an optionally substituted divalent linking group, which are preferably groups as defined above for the groups $L^2$ and $L^3$.

The terminal groups $R^3$ and $R^4$ are preferably represented by hydrogen, an optionally substituted alkyl or cycloalkyl group, an optionally substituted aryl group, an optionally substituted aralkyl group or an optionally substituted heteroaryl group. Suitable alkyl groups include 1 or more carbon atoms such as for example $C_1$ to $C_{22}$-alkyl groups, more preferably $C_1$ to $C_{12}$-alkyl groups and most preferably $C_1$ to $C_6$-alkyl groups. The alkyl group may be linear or branched such as for example methyl, ethyl, propyl (n-propyl, isopropyl), butyl (n-butyl, isobutyl, t-butyl), pentyl, 1,1-dimethyl-propyl, 2,2-dimethylpropyl and 2-methylbutyl, or hexyl. Suitable cycloalkyl groups are non-aromatic, homocyclic groups containing carbon atoms and may be monocyclic- or polycyclic. Examples include cyclopentyl, cyclohexyl or adamantyl. Suitable aryl groups include for example phenyl, naphthyl, benzyl, tolyl, ortho- meta- or para-xylyl, anthracenyl or phenanthrenyl. Suitable aralkyl groups include for example phenyl groups or naphthyl groups including one, two, three or more $C_1$ to $C_6$-alkyl groups. Suitable heteroaryl groups are preferably monocyclic- or polycyclic aromatic rings comprising carbon atoms and one or more heteroatoms in the ring structure. Preferably 1 to 4 heteroatoms independently selected from nitrogen, oxygen, selenium and sulphur and/or combinations thereof. Examples include pyridyl, pyrimidyl, pyrazoyl, triazinyl, imidazolyl, (1,2,3,)- and (1,2,4)-triazolyl, tetrazolyl, furyl, thienyl, isoxazolyl, thiazolyl and carbazoyl.

More preferably $R^3$ and $R^4$ are independently represented by hydrogen or an optionally substituted alkyl, aryl or aralkyl group, and/or combination thereof. Most preferably, $R^3$ and $R^4$ independently represent hydrogen or methyl. The alkyl, cycloalkyl, aralkyl, aryl or heteroaryl groups may include one or more substituents. The optional substituents on the alkyl, cycloalkyl, aralkyl, aryl or heteroaryl groups are preferably selected from an alkyl group such as a methyl, ethyl, n-propyl, isopropyl, n-butyl, 1-isobutyl, 2-isobutyl and tertiary-butyl group; an ester, amide, ether, thioether, ketone, aldehyde, sulfoxide, sulfone, sulfonate ester or sulphonamide group, a halogen such as fluorine, chlorine, bromine or iodine, —OH, —SH, —CN and —NO2, and/or combinations thereof.

Specific examples of suitable barrier compounds for use in the present invention are given below in Table A.

TABLE A

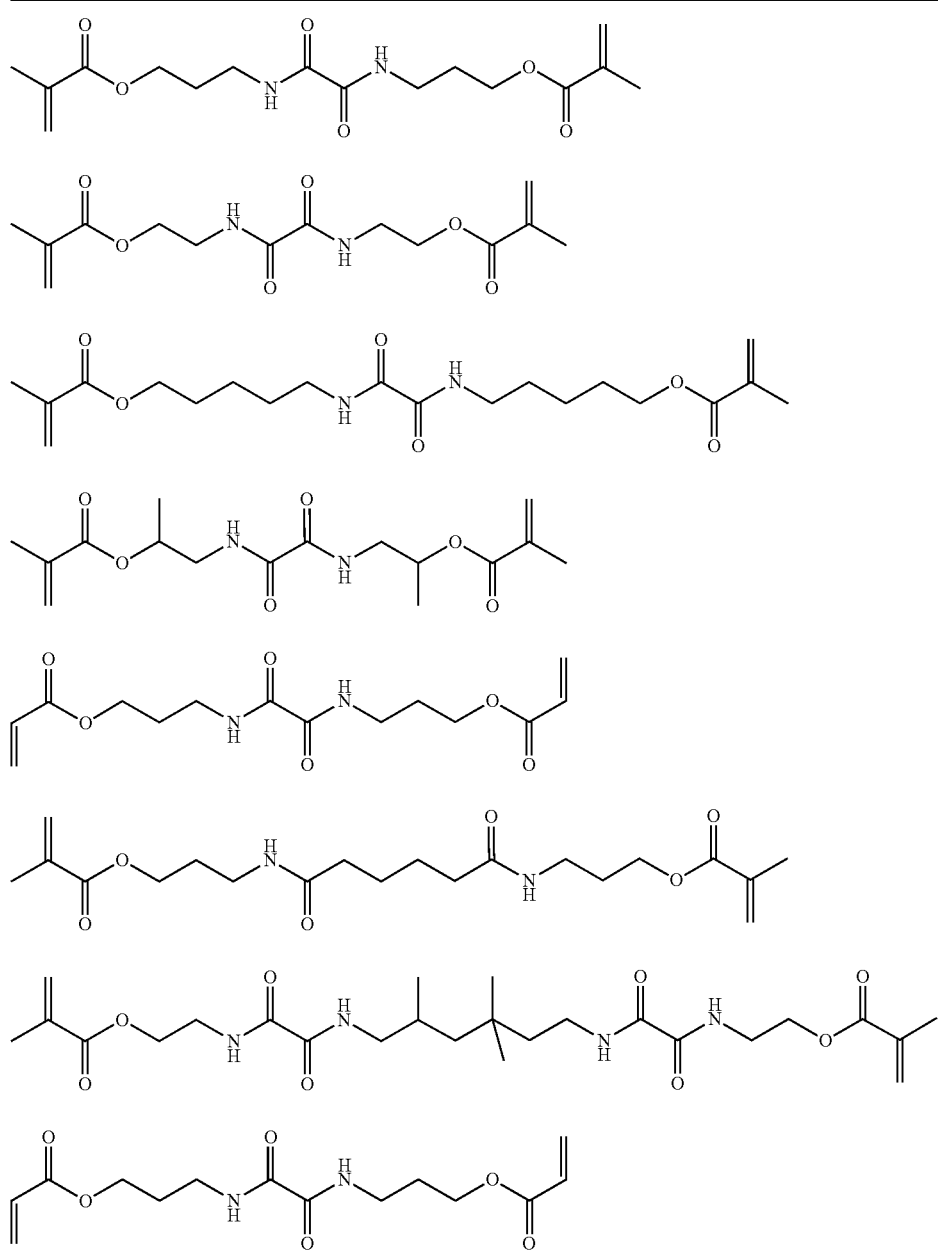

TABLE A-continued
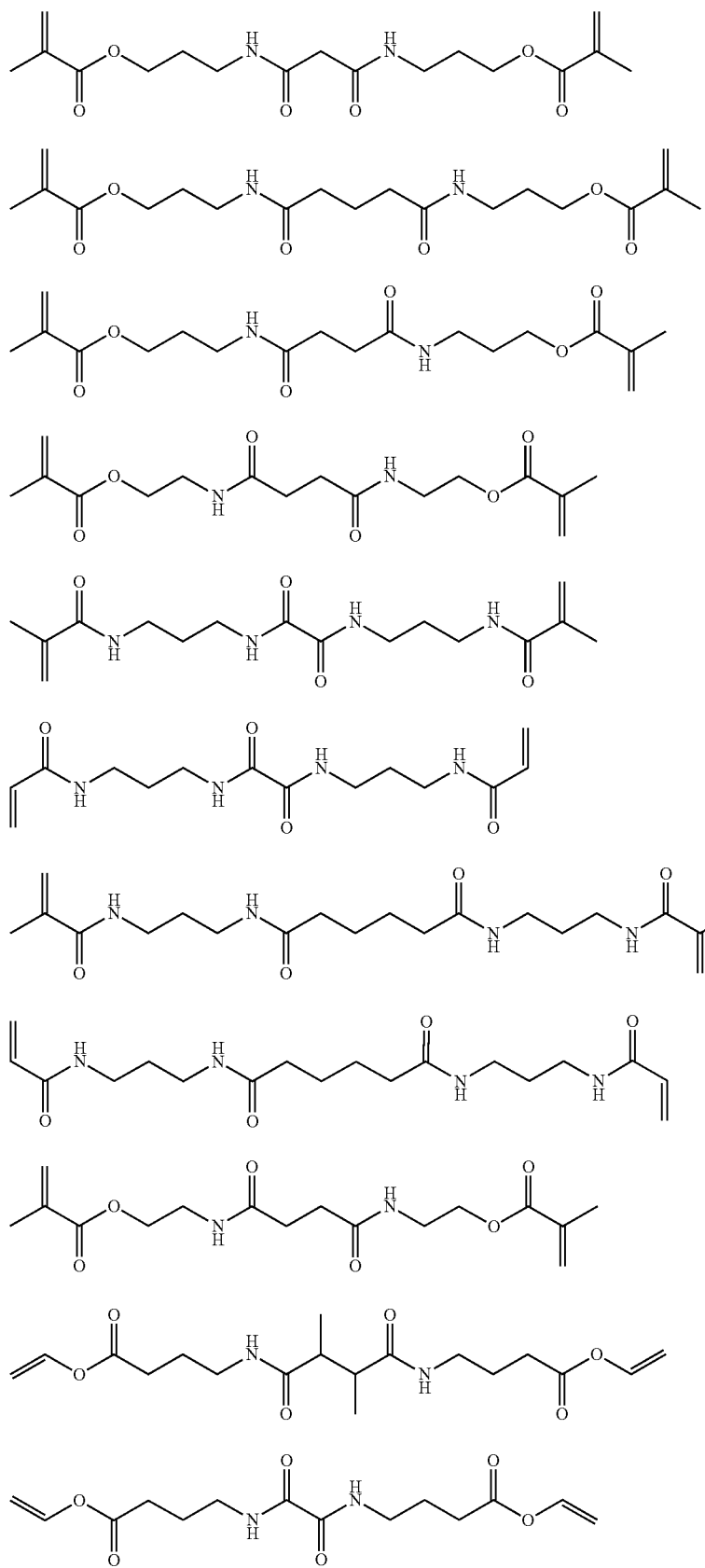

TABLE A-continued
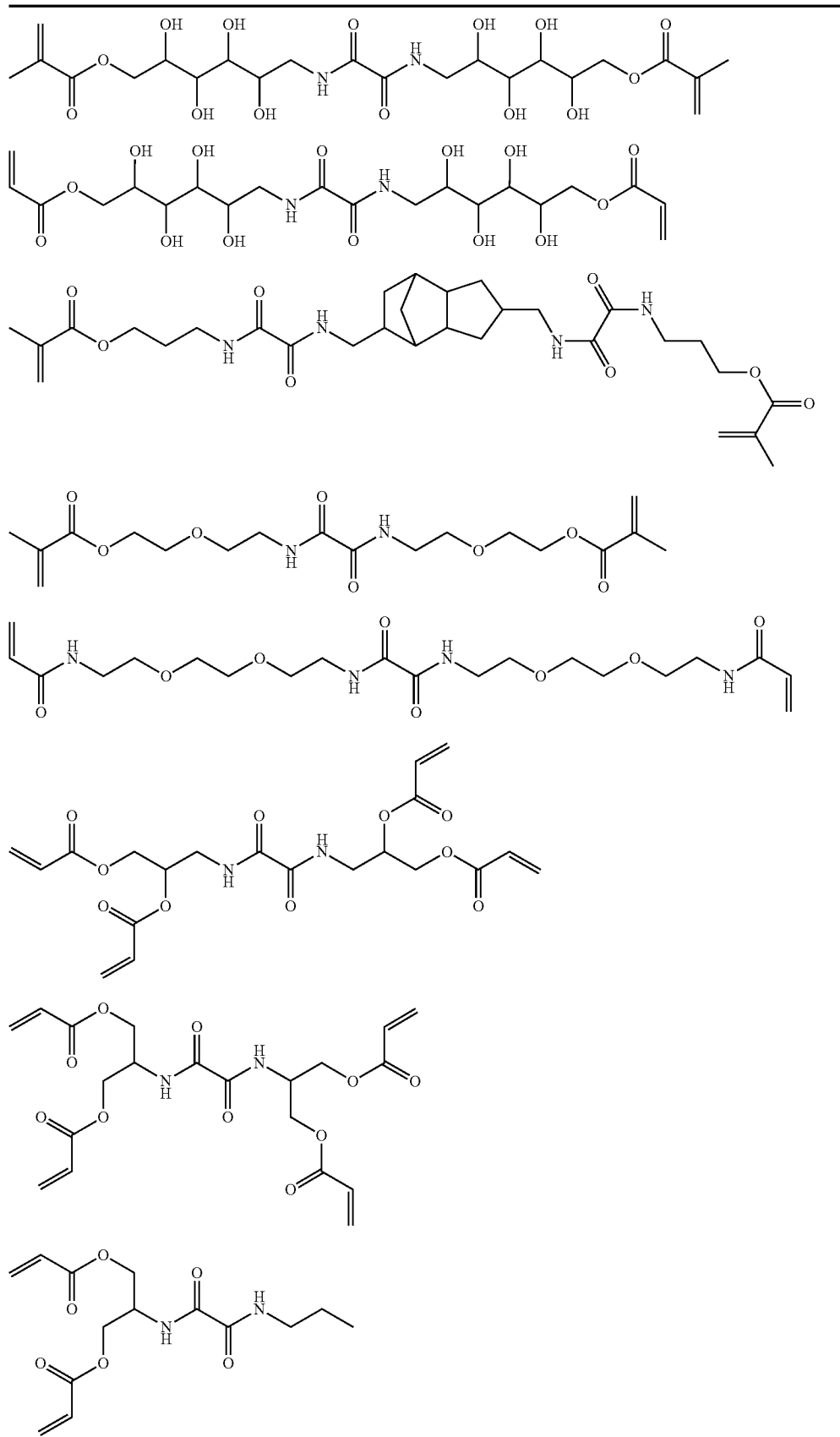

TABLE A-continued
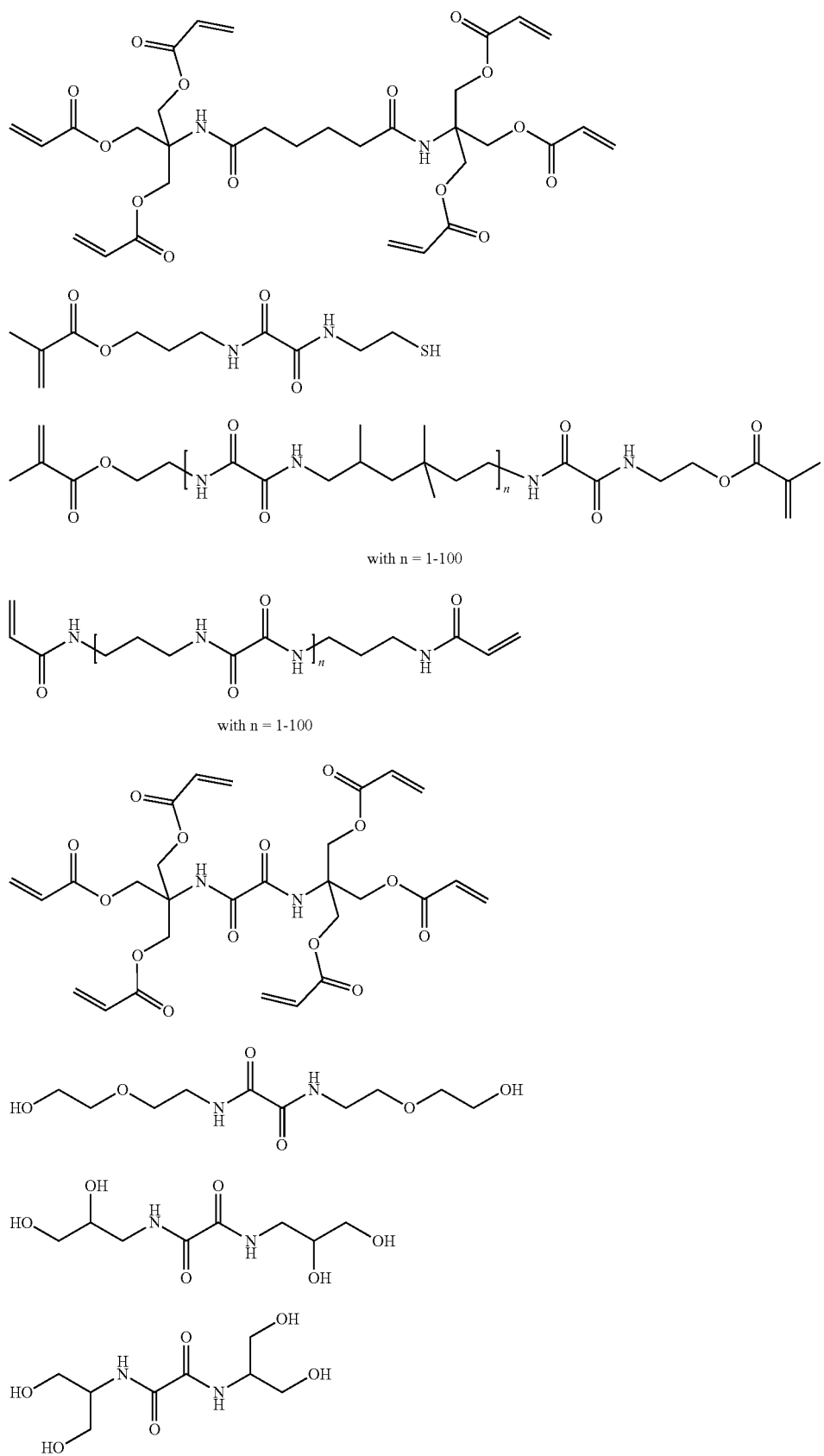

TABLE A-continued
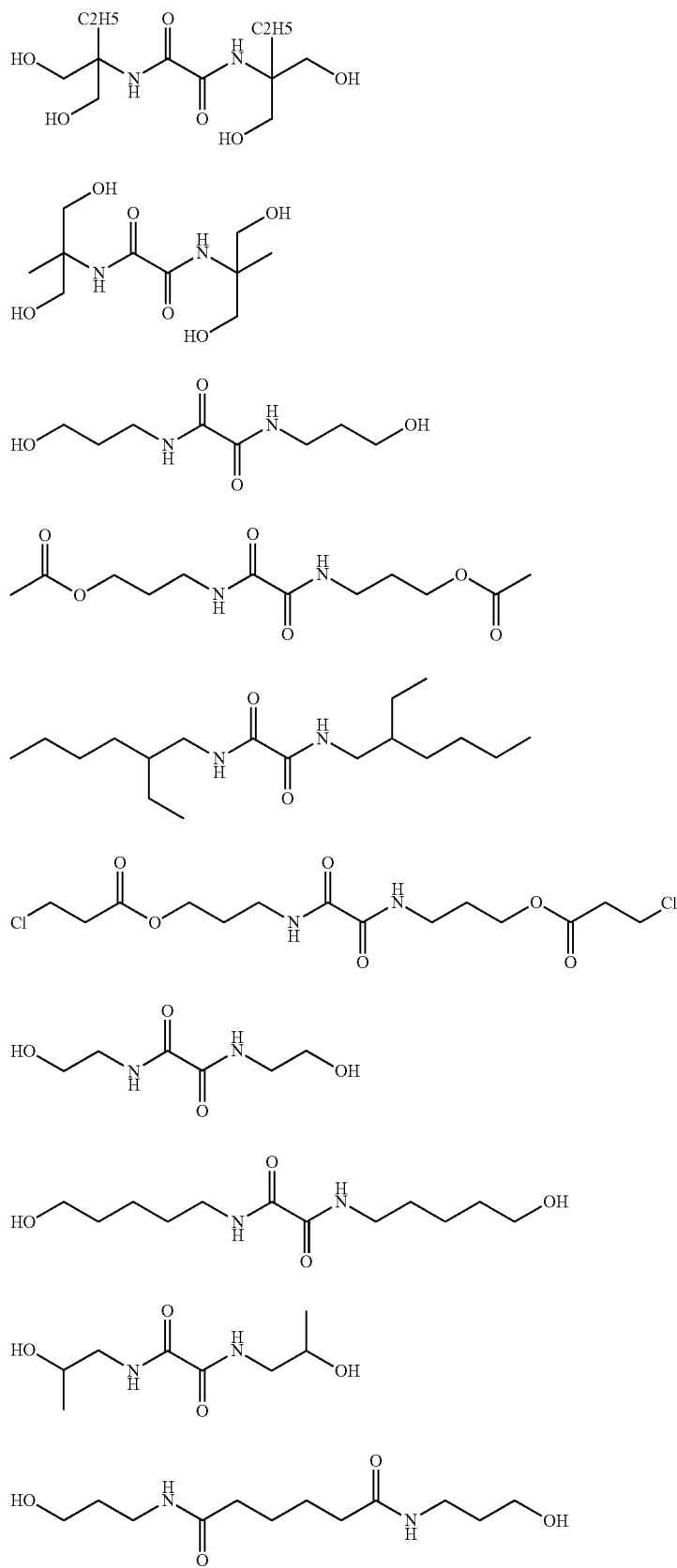

TABLE A-continued
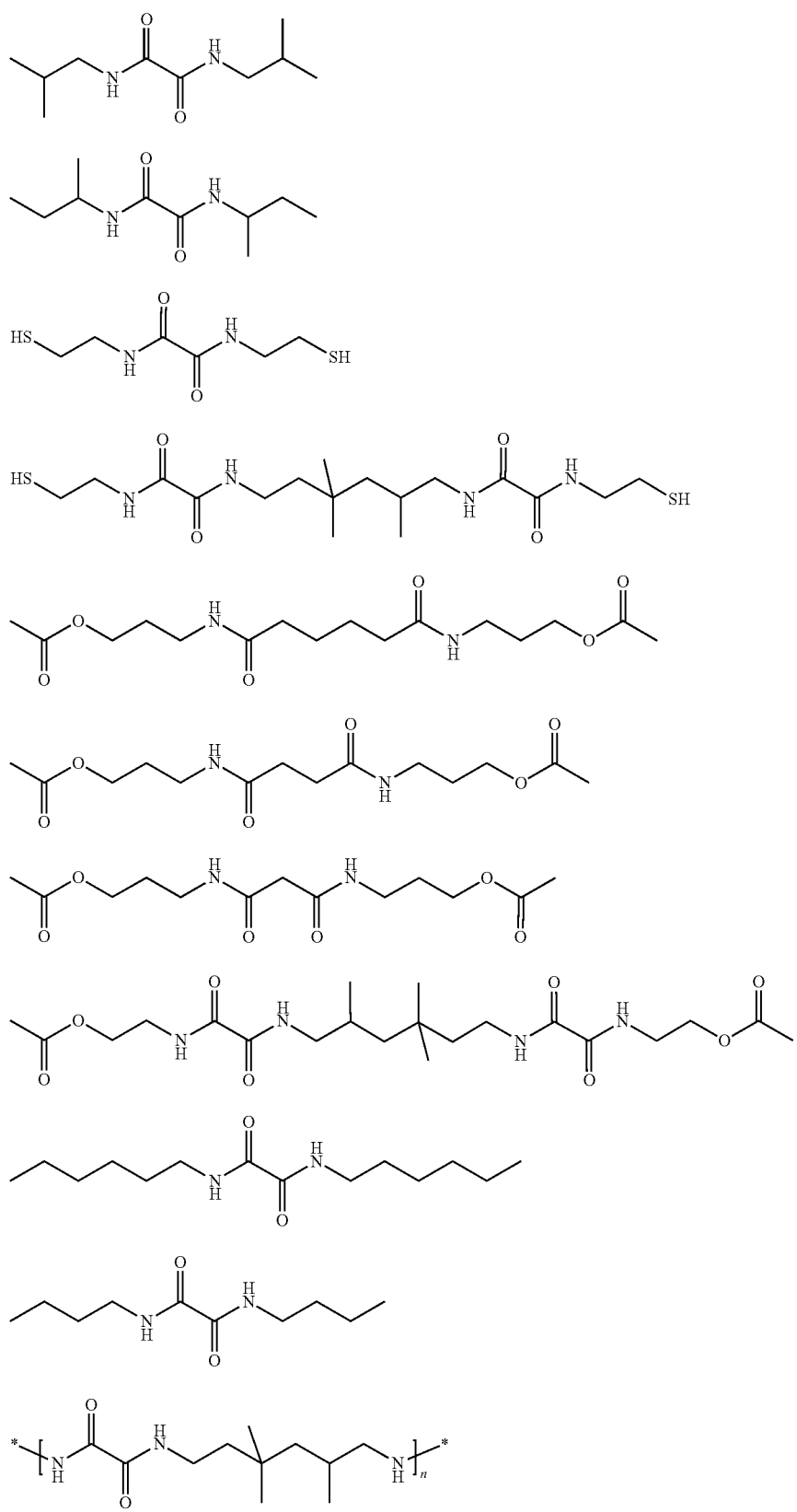
with n = 1-100

TABLE A-continued

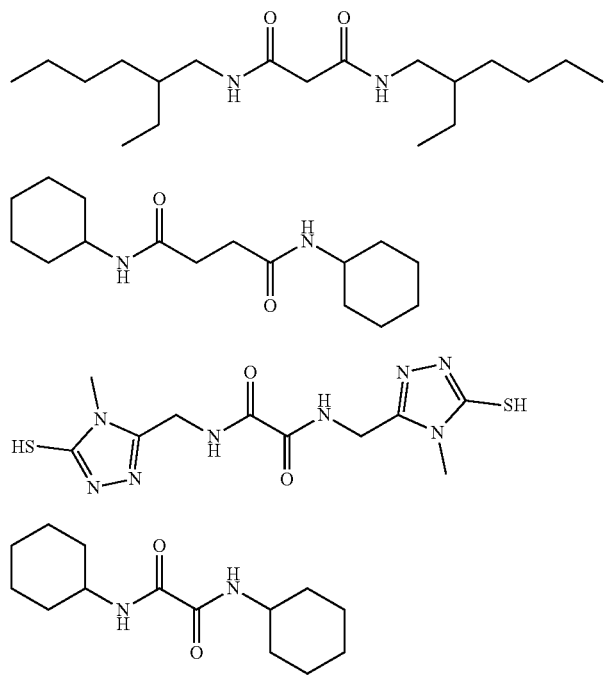

According to alternative embodiments of the barrier means, the extent of premature diffusion and/or intermixing can be reduced by adhering the low-molecular radical inhibitor to a high-molecular compound. Upon heating, the inhibitor is released from said high-molecular compound and allowed to diffuse into the image recording layer. Preferred embodiments are obtained by binding the inhibitor covalently to a polymer, by encapsulating the inhibitor in a polymer capsule or by charging polymer particles with the inhibitor.

According to a first embodiment wherein the low-molecular radical inhibitor is adhered to a polymer, the inhibitor can be part of the backbone of a polymer which releases the low-molecular radical inhibitor by thermally induced backbone degradation, or it can be part of a side group linked to the backbone of a polymer which releases the low-molecular radical inhibitor by thermal side group degradation, e.g. by the cleavage of a thermally fragile linking group. Several thermally degradable groups have been disclosed in the literature including thermal sulfoxide elimination, thermolytical beta-elimination of a functional group in beta-position compared to an electron withdrawing group such as an ester, an amide and a sulfone and thermolytical cleavage of secondary, and more preferably tertiary esters of carboxylic acids, sulfonic acids, phosphonic acids and phosphoric acid, tertiary carbamates, tertiary ethers and tertiary carbonates. The thermal degradation can be accelerated by acid catalysis, wherein the acid can be generated from a thermo-acid or a photo-acid. Typically thermally degradable resins, optionally acid catalyzed, are disclosed by Okamura et al. in Journal of Photopolymer Science and Technology, 24(5), 561-564 (2011); Okamura et al., Reactive and Functional Polymers, 71(4), 480-488 (2011); Fouassier J. P., Allonas X., Basics and Applications of Photopolymerization Reactions, 2, 235-244 (2010)) and as resins in additive manufacturing (US20170120515, WO20170487100). Palmieri et al. discloses the use of an acid-degradable resist in nanoimprint lithography (ACS Nano, 1(4), 307-312 (2007)). generating the low-molecular radical inhibitor from a high-molecular compound In another embodiment, intermixing and premature diffusion can be avoided or reduced by encapsulating the low-molecular radical inhibitor into a micro- or nanocapsule that is added to the overcoat and is capable of releasing the inhibitor upon heating. A micro- or nanocapsule is defined as a core-shell structure comprising a polymeric shell, which is degradable or becomes permeable upon heating, around a core which comprises the low-molecular radical inhibitor. The capsules are preferably prepared by interfacial polymerization, e.g. interfacial polycondensation. Interfacial polymerization is well-known, as described in recent reviews e.g. by Zhang Y. and Rochefort D. (Journal of Microencapsulation, 29(7), 636-649 (2012) and by Salitin (in Encapsulation Nanotechnologies, Vikas Mittal (ed.), chapter 5, 137-173 (Scrivener Publishing LLC (2013)). In general, interfacial polymerization requires the dispersion of an oleophilic phase in an aqueous continuous phase or vice versa, thereby forming an emulsion. Each of the phases contains at least one dissolved monomer (a first shell component in e.g. the oleophilic phase) that is capable of reacting with another monomer (a second shell component) dissolved in the other phase, e.g. the aqueous phase. The two monomers meet at the interface of the emulsion droplets and react rapidly. The polymer thereby formed is insoluble in both the aqueous and the oleophilic phase. As a result, the formed polymer has a tendency to precipitate at the interface between both phases, thereby forming a shell around the dispersed core. A more specific description of capsules which are suitable for the present invention can be found in WO2015/158654, WO2015/158592 and WO2016/184504, with the proviso that the released component is replaced by the low-molecular radical inhibitor that is used in the present invention.

According to still another embodiment, intermixing and premature diffusion can also be avoided or reduced by charging a polymer particle with the low-molecular radical inhibitor that is used in the present invention. The charged polymer particle is added to the overcoat and is capable of releasing the inhibitor upon heating. The polymer particles are preferably latex particles, i.e. polymer particles which form a stable aqueous dispersion. The polymer particles are preferably self-dispersible particles, which can be obtained by incorporating a monomer comprising a carboxylic acid group, a sulfonic acid group or a phosphoric acid group. For polyurethane particles, the self-dispersing group may be incorporated via a diol and/or a diamine having any of phosphate group, a sulfonic acid group, a N, N-disubstituted amino group, a carboxyl group, a neutralized phosphate group, a neutralized sulfonic acid group, a neutralized N, N-disubstituted amino group and a neutralized carboxyl group. The polymer particles can be charged with the low-molecular radical inhibitor by the following method. The inhibitor is first dissolved in a water-immiscible organic solvent having a boiling point of lower than 100° C. This solution is then finely dispersed in water or an aqueous medium, for example by a homogenizer, a microfluidizer or very high speed stirring in order to form an oil-in-water emulsion. The emulsion thus obtained is then added while stirring to an aqueous medium containing dispersed polymer particles. The organic solvent is then distilled off whereby the inhibitor is transferred from the organic solvent phase to the polymer particles as they become insoluble in the aqueous phase. Specific examples of suitable polymer particles and solvents are described in e.g. WO2016/184504.

Exposure Step

The method of the present invention comprises the step of exposing a plate precursor to UV, violet or IR light, preferably by means of a laser. The UV and violet light is preferably radiation having a wavelength in the range from 350 to 450 nm, more preferably from 360 to 420 nm and most preferably from 400 to 410 nm. Preferred UV and violet lasers are laser diodes, in particular a gallium-nitride diode, emitting at 375 nm or 405 nm respectively. Also a frequency-doubled gallium arsenide diode emitting at 410 nm can be used. The IR light is preferably near-IR radiation having a wavelength in the range from 750 to 1100 nm, more preferably from 780 to 850 nm. Preferred IR lasers are laser diodes emitting at about 830 nm or a Nd:YAG laser emitting at 1064 nm.

The sensitivity of the plate precursor, defined as the energy density of the laser beam measured at the surface of the coating of the plate, which is necessary to render the image recording layer resistant to the developer, is generally between 0.01 and 250 mJ/cm$^2$, more preferably between 0.1 and 10 mJ/cm$^2$ for plates sensitized to (ultra)violet light and 50 to 200 mJ/cm$^2$ for plates sensitized to infrared light. The optimal value is not only dependent on the wavelength but also on the nature and the thickness of the overcoat: a plate with a thin overcoat is less protected against oxygen quenching and therefore requires more energy than a plate with a thick overcoat.

Also the extent of intermixing and/or premature diffusion will affect the sensitivity of the plate precursor due to migration of the low-molecular radical inhibitor from the overcoat to the image recording layer. In an ideal material no intermixing or premature diffusion occurs, so that the image recording layer is highly sensitive to the light used for the image-wise exposure and becomes much less sensitive during the heating step which induces the diffusion of the radical inhibitor to the image recording layer. However, when intermixing and/or premature diffusion occurs, it is preferred to include barrier means in the material, as explained in the previous section.

The image-wise exposure may be performed in safelight, which does not emit in the wavelength range wherein the image recording layer has a substantial sensitivity, e.g. yellow safelight. Plate setting equipment which enables automatic plate handling and exposure in complete darkness are commercially available from a wide group of suppliers. Most plate setters are mechanically coupled to a processing apparatus so that the plates are automatically developed immediately after exposure. The heating step in accordance with the present invention may be carried out in the plate setting equipment, in the processing apparatus, or in an intermediate heating unit. Preferably, the method of the present invention is performed in an automatic plate making line comprising a plate setter which comprises one or more plate supply cassettes and which is mechanically coupled to a processor that is equipped with a pre-heat unit ("pre" indicates prior to development) wherein the heating step in accordance with the present invention is carried out.

Heating Step

According to the present invention, the plate precursor is heated after the image-wise exposure in order to induce diffusion of the radical inhibitor from the overcoat to the image recording layer, thereby reducing its daylight sensitivity. The heating may be produced by any means such as an IR-lamp, heated air or one or more heated contact rolls. In a preferred embodiment, the heating is carried out in an oven, e.g. a similar oven as those which are typically used in the prior art for 'pre-heating' the plate prior to development. The plate precursor may be heated at a temperature between 80° C. and 300° C., preferably between 100° C. and 250° C. and more preferably between 120° and 200° C. The heating time is preferably between 2 seconds and 30 minutes, more preferably between 10 seconds and 15 minutes and most preferably from 1 to 10 minutes.

Instead of overall heating the plate, the heat may also be applied selectively, i.e. only to the parts of the plate which have not been image-wise exposed to (ultra)violet or infrared light. The exposed parts actually benefit from a high daylight sensitivity because the exposure to daylight after the image-wise exposure induces a further hardening of the image, resulting in a higher run length on the press. As a result, it is advantageous not to apply an overall heating to induce diffusion of the radical inhibitor but instead to apply a selective heating of the non-image parts only, e.g. by means of a scanning infrared laser emitting at a wavelength to which the image recording layer is not substantially sensitive. Such IR laser may be integrated in the plate setting equipment that is used for the image-wise exposure. The infrared light can be absorbed in the overcoat by the addition of dyes or pigments, which convert the absorbed light into heat. The scanning infrared laser may simultaneously produce a visible image in the overcoat, e.g. by bleaching a visible dye or by transforming a leuco or thermochromic dye in a more colored form. Overall heating and selective heating may also be combined in a single step.

Processing

Subsequently to the image-wise exposure step and the heating step, the plate precursor is processed (developed), which involves the treatment with a processing liquid (developer) to remove the non-image areas of the coating from the support without substantially removing the image areas. The image areas may be removed by dissolution and/or dispersion of the coating ingredients into the developer and/or by mechanical disruption of the coating from the support. As a result, a lithographic image of printing and non-printing areas is obtained.

The overcoat is preferably removed together with the non-image areas of the recording layer in a single treatment. Alternatively, a pre-wash step may be carried out to remove the overcoat before subjecting the image recording layer to development. The pre-wash step can be carried out in a stand-alone apparatus or by manually rinsing the plate precursor with water or the pre-wash step can be carried out in a washing unit that is integrated in a processor used for developing the image recording layer. The washing liquid is preferably water, more preferably tap water. More details concerning the wash step are described in e.g. EP1788434, par. [0026].

Any developer known in the prior art for processing the free-radical polymerizable or crosslinkable image recording layer can be used, e.g. an alkaline developer as described in US2005/0162505 or a solvent-based developer. More preferably, the developer is an aqueous gum solution which is capable of simultaneously developing and gumming the image in a single step as described in WO2005/111727. The gum developer preferably has a pH close to neutral, e.g. from 5 to 9.

The developer can be applied to the plate by various means, e.g. by wiping developer onto the plate with an impregnated pad, by dipping or immersing the plate into the developer, by coating, spraying or pouring developer onto the plate, either by hand or in an automatic processing apparatus (processor). The treatment with a developer may also be combined with mechanical rubbing of the coating, e.g. with a sponge or a rotating brush. Off-press development is preferably carried out in a processor comprising a double development unit in a cascade configuration as described in WO2007/057349.

The development of the lithographic image may also be carried out on-press, by mounting the plate precursor on a plate cylinder of a lithographic printing press and rotating the plate cylinder while feeding fountain and/or ink to the precursor. The on-press processing is preferably carried out without any other wet treatment before the plate precursor is mounted on the press. The fountain and/or ink then act as developer which removes the non-image areas of the coating from the support. Alternatively, an off-press wet treatment may first be carried out, e.g. to remove the overcoat, before the plate precursor is mounted on the plate cylinder for further on-press development.

In a preferred on-press development method, the removed coating is preferably transferred together with the ink to the paper so that the fountain supply of the press is not contaminated. In order to reduce paper waste, the image is preferably fully developed (i.e. complete removal of the non-printing areas and full ink uptake by the printing areas of the plate) within the first 50 revolutions, more preferably within the first 20 revolutions of the plate cylinder. Some plate precursor develop better on-press when only fountain is supplied to the plate in the first 60 seconds, more preferably the first 30 seconds and most preferably the first 15 seconds, after the start of the press and then the ink supply is also switched on. In an alternative embodiment, supply of fountain and ink can be started simultaneously or only ink can be supplied during a number of revolutions before switching on the supply of fountain.

EXAMPLES

| List of ingredients | |
|---|---|
| Alberdingk U180 | 50 wt. % aqueous dispersion of an aliphatic polyester polyurethane from Alberdingk Boley. |
| Albritect CP 30 | 20 wt. % aqueous dispersion of a copolymer of vinylphosphonic acid and acrylic acid from Rhodia. |
| S-Lec BX35Z | copolymer of vinyl alcohol, vinyl acetate, vinyl butyral and vinyl acetal from Sekisui Chemical Co. Ltd. |
| Mowiol 4-88 | partially (about 88%) hydrolyzed poly(vinyl alcohol) with M ≅ 27000 from Kuraray. |
| CN 104 | epoxy acrylate oligomer from Arkema. |
| FST 510 | diurethane dimethylacrylate from AZ Electronic Materials GmbH. |
| SR368 | tris (2-hydroxy ethyl) isocyanurate triacrylate from Sartomer (Arkema group). |
| HABI 1-2 | dimer of a triaryl-imidazole from Hodogaya Chemical having the following formula: |

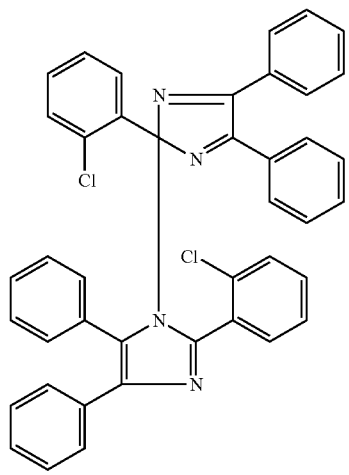 [SMILES: Clc1ccccc1-c1nc(-c2ccccc2)c(-c2ccccc2)n1C1(c2ccccc2Cl)N=C(c2ccccc2)C(c2ccccc2)=N1]

| List of ingredients | |
|---|---|
| Fluomix | mixture of the following sensitizers (synthesis described in WO2008/145528): |

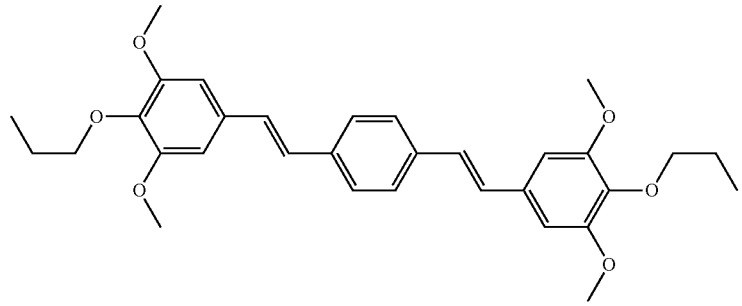

15 wt. %

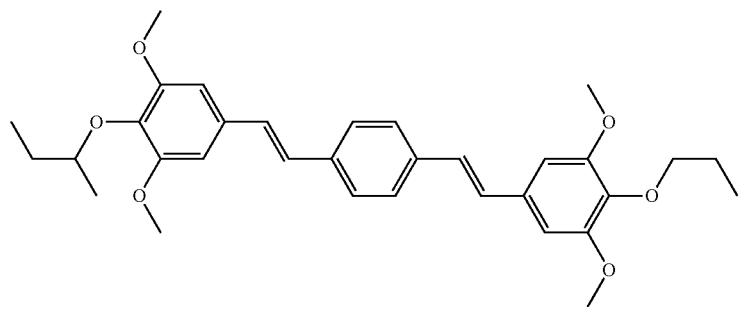

38 wt. %

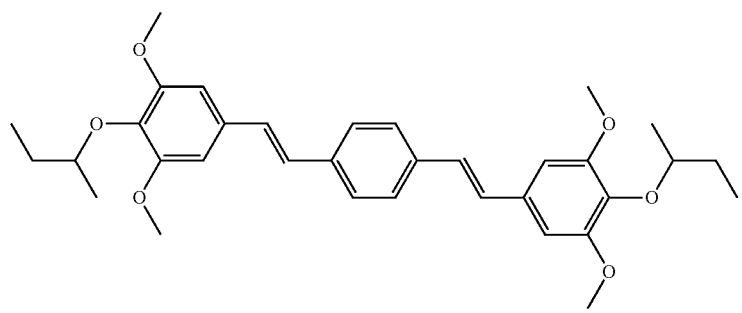

47 wt. %

| | |
|---|---|
| Tegoglide 410 | surfactant from Evonik Tego Chemie GmbH. |
| Lutensol A8 | surface active agent from BASF. |
| Ebotec MB-SF | biocide from Bode Chemie Hamburg GmbH. |
| JPA-528 | mixture of phosphate esters of polyethylene glycol monomethacrylate from Johoku Chemical Company Ltd. |
| Sipomer PAM 100 | mixture of phosphate esters of polyethylene glycol monomethacrylate from Rhodia. |
| Leuco Crystal Violet | compound having the following formula: |

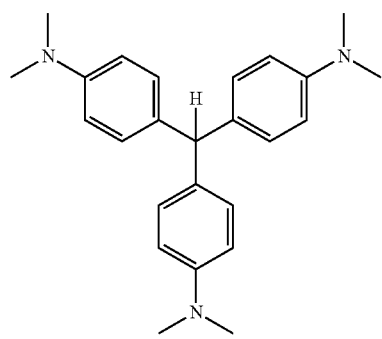

-continued

| List of ingredients | |
|---|---|
| Compound A | low-molecular radical inhibitor Irgastab UV-10 from Ciba-Geigy: |

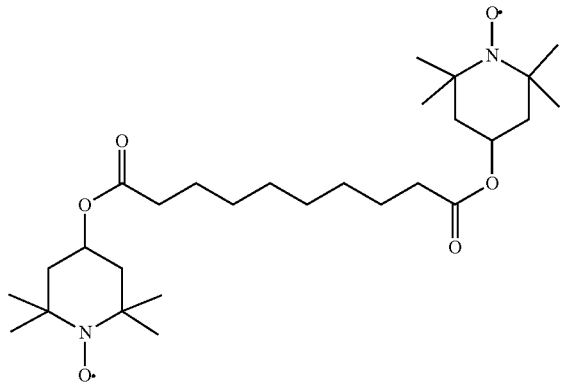

| | |
|---|---|
| Compound B | oxamide derivative having the following structure: |

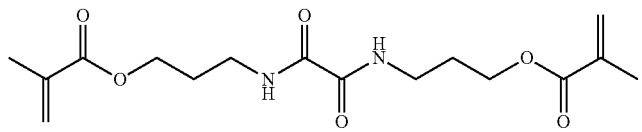 [SMILES: C=C(C)C(=O)OCCCNC(=O)C(=O)NCCCOC(=O)C(=C)C]

Examples 1 to 8

Examples 1 to 4 comprised image recording layers PL-1 to PL-4 respectively. These were produced by coating a solution of the components in Table 1 on a conventional aluminum support which had been electrochemically grained with hydrochloric acid and anodized with sulfuric acid without a further post-anodic treatment. The support had a surface roughness Ra of about 0.40 µm (measured by interferometry) and an aluminum oxide weight of 3.0 g/m². The components were dissolved in a mixture of 36 wt. % of methyl-ethyl-ketone, 63 wt. % of 1-methoxy-2-propanol and 1 wt. % of water. Each coating solution was applied at a wet coating thickness of 30 µm and then dried at 120° C. for 1 minute in a circulation oven.

Half of each material PL-1 to PL-4 was provided with an overcoat OC-1 on top of the image recording layer, thereby obtaining Examples 1-4. The other half was provided with overcoat OC-2 to produce Examples 5-8. Contrary to OC-1, OC-2 contained the low-molecular radical inhibitor Compound A. Each of the overcoats was applied as a solution in water of the composition defined in Table 2 (wet coating thickness 20 µm) and then dried at 50° C. for 5 minutes.

TABLE 1

| components of image recording layer (dry weight, mg/m²) | | | | | |
|---|---|---|---|---|---|
| (defined above) | PL-1 | PL-2 | PL-3 | PL-4 | PL-5 |
| Tegoglide 410 | 2.1 | 2.1 | 2.1 | 2.1 | 2.1 |
| Alberdingk U180 | 180.0 | 180.0 | 180.0 | 180.0 | 180.0 |
| CN104 | 325.0 | 325.0 | 325.0 | 325.0 | 325.0 |
| FST 510 | 260.0 | 260.0 | 260.0 | 260.0 | 260.0 |
| HABI 1-2 | 127.7 | 127.7 | 127.7 | 127.7 | 127.7 |
| Fluomix | 106.1 | 106.1 | 106.1 | 106.1 | 106.1 |
| 2-mercapto-benzimidazole | 14.4 | 14.4 | 14.4 | 14.4 | 14.4 |

TABLE 1-continued

| components of image recording layer (dry weight, mg/m²) | | | | | |
|---|---|---|---|---|---|
| (defined above) | PL-1 | PL-2 | PL-3 | PL-4 | PL-5 |
| Leuco Crystal Violet | 10.0 | 10.0 | 10.0 | 10.0 | 10.0 |
| JPA-528 | 130.0 | 130.0 | 130.0 | 130.0 | 130.0 |
| Compound B | — | 25.0 | 50.0 | 100.0 | 290.0 |

TABLE 2

| components of overcoat (dry weight, mg/m²) | | |
|---|---|---|
| (defined above) | OC-1 | OC-2 |
| Mowiol 4-88 | 617.38 | 617.38 |
| Ebotec MB-SF | 1.00 | 1.00 |
| Lutensol A8 | 6.63 | 6.63 |
| Compound A (*) | — | 50.00 |

(*) added as a dispersion in water containing 5 wt. % of Mowiol 4-88 and 5 wt. % of Compound A in water These materials were subjected to simulated daylight by a flood exposure with fluorescent tubes TL-D58W/840 from Philips (color code=840; correlated color temperature=4000K; color rendering index=82). The light intensity measured at the surface of the coating of the plate precursors was about 1000 lux. The plate precursors were covered with a step wedge during the exposure, ranging from a light transmission of 100% (1000 lux at step 1) to 0.3% (3 lux at step 18). After the exposure during 60 minutes, the plates were processed with a Violet CF GUM-NP developer in an Azura $C_{95}$ processor at a speed of 60 cm/min and a temperature of 21° C. (all processing materials from Agfa NV, Belgium). Materials which develop well in this processing system are typically also suitable for on-press processing.

The plates were then visually inspected in order to establish at which step the image recording layer started to show fogging, i.e. was not completely removed from the support by the developer because the daylight triggered sufficient polymerization to render the image recording layer resistant to the developer. In Table 3, the daylight stability is expressed as the maximum amount of daylight (light intensity in lux multiplied by time in minutes) which the material can tolerate without fogging: for instance, Example 1 showed no more fogging from step 14 onwards which corresponds to a light intensity of 11 lux; the daylight stability of Example 1 was thus 11 lux·60 minutes=660 lux·min.

A typical office or print shop environment has a light intensity of about 500 lux, so a value of 660 lux·min indicates that the material is clearly not daylight-stable, since it would start fogging after just a bit more than one minute (660/500=1.3) of exposure to daylight. Table 3 shows that none of the Examples 1 to 8 were daylight-stable if no heating step is carried out before the daylight exposure: the best result (Example 5: 4500 lux·min) represents a material which starts fogging in ambient light of 500 lux after just 9 minutes.

The daylight exposure test was then repeated with another sample of the same Examples 1 to 8, which were first subjected to heating in an oven with forced air circulation at a temperature of 130° C. during 5 minutes and then subjected to the daylight exposure and processing as described above. The results in Table 3 show that Examples 1 to 4 which did not comprise a low-molecular radical inhibitor, remained highly sensitive to daylight also after heating, while the heating step reduced the light sensitivity of Examples 5 to 8 to such an extent that the plates had become daylight-stable, since no fogging was observed at wedge step 1 (1000 lux during 60 minutes). These results demonstrate that the heating step enables Compound A to diffuse to the image recording layer and thereby reduces its light sensitivity to a level which allows handling of the exposed and heated plate in a typical environment (500 lux) during at least 2 hour (60000 lux·min=500 lux·120 min).

TABLE 3

| Example No. | image recording layer (*) | overcoat (**) | Daylight Stability (lux · min) no heating | heating at 130° C. for 5 min |
|---|---|---|---|---|
| 1 | PL-1 (0) | OC-1 (0) | 660 | 660 |
| 2 | PL-2 (25) | OC-1 (0) | 960 | 1320 |
| 3 | PL-3 (50) | OC-1 (0) | 960 | 1920 |
| 4 | PL-4 (100) | OC-1 (0) | 660 | 1320 |
| 5 | PL-1 (0) | OC-2 (50) | 4500 | >60000 |
| 6 | PL-2 (25) | OC-2 (50) | 3180 | >60000 |
| 7 | PL-3 (50) | OC-2 (50) | 3780 | >60000 |
| 8 | PL-4 (100) | OC-2 (50) | 3780 | >60000 |

(*) figure in parentheses is the amount of Compound B in mg/m$^2$.
(**) figure in parentheses is the amount of Compound A in mg/m$^2$.

It should be noted however that Examples 5 to 8 were rather insensitive to laser light (before heating) due to the combination of a high amount of Compound A in the overcoat and a certain extent of intermixing and/or premature diffusion thereof in the image recording layer. As will be shown in the next Examples 9 to 13, the extent of intermixing and/or premature diffusion can be reduced by using a high amount of barrier Compound B in the image recording layer.

Examples 9 to 13

The composition of Examples 9 to 13 is shown in Table 4. Coating and drying conditions were the same as for Examples 1 to 8. The daylight stability was evaluated in the same way as described above for Examples 1 to 8, with the proviso that the exposure time was only 30 minutes instead of 60. In addition, also the violet laser (405 nm) sensitivity of these Examples was evaluated by exposing a solid image on fresh (unheated) samples with a Polaris plate setter (trademark of Agfa NV, Belgium) at an energy density of 0.081 mJ/cm$^2$ through a step wedge and then processing the samples in the same way as described above for the daylight stability test. The last column of Table 4 shows the number of the step at which 50% of the color density (produced by conversion of the Crystal Violet leuco dye) was obtained, relative to the color density of a fully exposed area. A higher step number indicates a higher laser sensitivity.

TABLE 4

| Example No. | image recording layer (*) | overcoat (**) | Daylight Stability (lux · min) heating at 130° C. for 5 min | Laser sensitivity (405 nm) no heating |
|---|---|---|---|---|
| 9 | PL-1 (0) | OC-1 (0) | 960 | 8 |
| 10 | PL-1 (0) | OC-2 (50) | >30000 | 0 |
| 11 | PL-5 (290) | none | 7530 | 6 |
| 12 | PL-5 (290) | OC-1 (0) | 10650 | 6 |
| 13 | PL-5 (290) | OC-2 (50) | >30000 | 4 |

(*) figure in parentheses is the amount of Compound B in mg/m$^2$.
(**) figure in parentheses is the amount of Compound A in mg/m$^2$.

The results of Examples 9 and 10 in Table 4 demonstrate that no image was formed upon exposure with the violet laser (at the low energy density used in this experiment) when a high amount of Compound A is added to the overcoat, which is due to intermixing and/or diffusion to the image recording layer. Contrary to Examples 9 and 10, Examples 11 to 13 comprised barrier Compound B in the image recording layer which reduces the extent of intermixing and/or diffusion, so that an acceptable laser sensitivity was retained while the daylight stability was substantially improved by the heating step (Example 13 compared to 10).

Examples 14 to 17

A solution of the components in Table 5 in a mixture of 36 wt. % of methyl-ethyl-ketone, 61 wt. % of 1-methoxy-2-propanol and 3 wt. % of water was coated on the same support as used for Examples 1-8. Each coating solution PL-6 and PL7 was applied at a wet coating thickness of 30 μm and then dried at 120° C. for 1 minute in a circulation oven. Examples 14, 15 and 16 were obtained by coating respectively OC-1, OC-3 and OC4 (defined in Tables 2 and 6) on top of the image recording layer PL-6. Example 17 was obtained by coating OC-1 on PL-7. All said overcoats were applied at a wet coating thickness of 20 μm and dried at 50° C. for 5 minutes.

TABLE 5

| components of image recording layer (dry weight, mg/m$^2$) | | |
|---|---|---|
| (defined above) | PL-6 | PL-7 |
| Tegoglide 410 | 2.1 | 2.1 |
| S-Lec BX35Z | 138.6 | 138.6 |
| FST510 | 298.0 | 298.0 |
| SR 368 | 298.0 | 298.0 |
| HABI 1-2 | 127.7 | 127.7 |
| Fluomix | 106.1 | 106.1 |
| 2-mercapto-benzimidazole | 14.4 | 14.4 |

TABLE 5-continued

| components of image recording layer (dry weigh it, mg/m²) | | |
|---|---|---|
| (defined above) | PL-6 | PL-7 |
| Pigment dispersion (*) | 90.0 | 90.0 |
| Albritect CP30 | 30.0 | 30.0 |
| Sipomer PAM 100 | 178.2 | 178.2 |
| Compound A | — | 12.96 |

(*)The pigment dispersion in Table 4 comprised 20 wt. % of Pigment Blue 60 having the following formula (CAS Reg. No. 81-77-6),

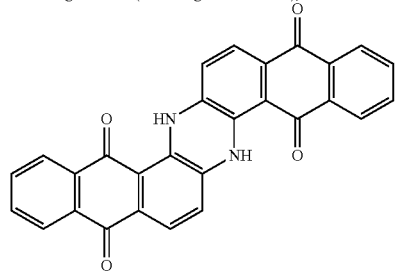

which was dispersed with 10 wt. % of Bykjet-9152 and 10 wt. % of Disperbyk-182 (both are dispersants from Byk-Chemie GmbH) in a mixture of 6.2 wt. % of 2-methoxy-1-methylethyl-acetate, 3.5 wt. % of propoxypropanol, 3.5 wt. % of n-butylacetate and 46.8 wt. % of 1-methoxy-2-propanol.

TABLE 6

| components of overcoat (dry weight, mg/m²) | | |
|---|---|---|
| (defined above) | OC-3 | OC-4 |
| Mowiol 4-88 | 617.38 | 617.38 |
| Ebotec MB-SF | 1.00 | 1.00 |
| Lutensol A8 | 6.63 | 6.63 |
| Compound A | 12.96 | 64.80 |

The daylight stability of these Examples was tested in the same way as described above for Examples 1-8. The results are summarized in Table 7, wherein daylight stability is expressed as defined above, i.e. the maximum amount of simulated daylight (lux·min) which the plate precursor can tolerate without fogging.

TABLE 7

| | image | | Daylight Stability (lux · min) | |
|---|---|---|---|---|
| Example No. | recording layer (*) | overcoat (*) | no heating | heating at 160° C. for 5 min |
| 14 | PL-6 (0) | OC-1 (0) | 480 | 1140 |
| 15 | PL-6 (0) | OC-3 (12.96) | 780 | 960 |
| 16 | PL-6 (0) | OC-4 (64.80) | 3780 | >60000 |
| 17 | PL-7 (12.96) | OC-1 (0) | >60000 | >60000 |

(*) figure in parentheses is the amount of Compound A in mg/m².

The amount of Compound A in the overcoat of Example 15 was too low to have a significant impact on the daylight stability (the results of Ex. 14 and 15 are about the same within experimental error). Example 16 contained 5 times more of Compound A and that amount produced a good daylight stability upon heating of at least 60000 lux·min, i.e. at least 2 hours at 500 lux.

Example 17 is a comparative embodiment, wherein the same amount of Compound A as in Example 16 was added to the image recording layer instead of the overcoat. The good daylight stability of Example 17 gives the false impression that it performs well, but the material is very insensitive to light of any wavelength and therefore not even capable of recording an image upon exposure within the practical settings of a typical plate setter. This demonstrates that the high amount of free-radical inhibitor which is required to produce a good daylight stability, cannot be added to the image recording layer but should be added to the overcoat in accordance with the present invention.

The invention claimed is:

1. A lithographic printing plate precursor comprising a support and provided thereon, in order,
a negative working image recording layer which undergoes a free-radical polymerization or crosslinking reaction upon exposure to ultraviolet, violet, or infrared light and
an overcoat which comprises (a) a low-molecular radical inhibitor, which is an organic compound having a molecular weight of less than 1000 Dalton, or (b) a polymer which releases a low-molecular radical inhibitor, which is an organic compound having a molecular weight of less than 1000 Dalton, upon heating, wherein the low-molecular radical inhibitor is present or released in the overcoat in an amount of at least 10 mg/m²,
characterized in that upon heating said low-molecular radical inhibitor is capable of diffusing to the image recording layer, thereby rendering the image recording layer less sensitive to daylight than before said heating.

2. The printing plate precursor of claim 1, wherein the image recording layer has a daylight stability after heating of at least 30000 lux·min.

3. The printing plate precursor of claim 1, wherein the image recording layer has a daylight stability after heating of at least 60000 lux·min.

4. The printing plate precursor of claim 1, wherein the low-molecular radical inhibitor is a nitroxyl compound.

5. The printing plate precursor of claim 2, wherein the low-molecular radical inhibitor is a nitroxyl compound.

6. The printing plate precursor of claim 1, wherein the image recording layer comprises one or more compounds having a chemical structure according to Formula:

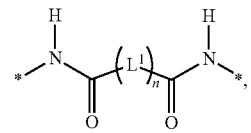

wherein n represents an integer equal to 0 or 1, $L^1$ represents a divalent linking group, and * denotes a chemical bond to the rest of the structure.

7. The printing plate precursor of claim 2, wherein the image recording layer comprises one or more compounds having a chemical structure according to Formula:

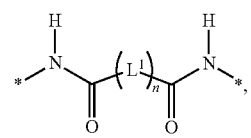

wherein n represents an integer equal to 0 or 1, $L^1$ represents a divalent linking group, and * denotes a chemical bond to the rest of the structure.

8. A method of making a lithographic printing plate comprising the steps of:

(a) image-wise exposing the lithographic printing plate precursor of claim 1 to ultraviolet, violet or infrared light;
(b) heating the plate precursor, thereby inducing diffusion of the low-molecular radical inhibitor to the image recording layer and rendering the image recording layer less sensitive to daylight than before said heating; and
(c) processing the plate precursor.

9. The method of claim 8, wherein step (c) is carried out by mounting the plate precursor on a plate cylinder of a lithographic printing press and rotating the plate cylinder while feeding fountain solution and/or ink to the plate precursor.

10. The method of claim 9, wherein during step (b) the plate precursor is heated for 1 to 10 minutes at a temperature from 120° C. to 200° C.

11. The method of claim 10, wherein the image recording layer has a daylight stability after the heating step (b) of at least 30000 lux·min.

12. A method of making a lithographic printing plate comprising the steps of:
(a) image-wise exposing the lithographic printing plate precursor of claim 4 to ultraviolet, violet or infrared light;
(b) heating the plate precursor, thereby inducing diffusion of the low-molecular radical inhibitor to the image recording layer and rendering the image recording layer less sensitive to daylight than before said heating; and
(c) processing the plate precursor.

13. The method of claim 12, wherein step (c) is carried out by mounting the plate precursor on a plate cylinder of a lithographic printing press and rotating the plate cylinder while feeding fountain solution and/or ink to the plate precursor.

14. The method of claim 13, wherein during step (b) the plate precursor is heated for 1 to 10 minutes at a temperature from 120° C. to 200° C.

15. The method of claim 14, wherein the image recording layer has a daylight stability after the heating step (b) of at least 30000 lux·min.

16. A method of making a lithographic printing plate comprising the steps of:
(a) image-wise exposing the lithographic printing plate precursor of claim 6 to ultraviolet, violet or infrared light;
(b) heating the plate precursor, thereby inducing diffusion of the low-molecular radical inhibitor to the image recording layer and rendering the image recording layer less sensitive to daylight than before said heating; and
(c) processing the plate precursor.

17. The method of claim 16, wherein step (c) is carried out by mounting the plate precursor on a plate cylinder of a lithographic printing press and rotating the plate cylinder while feeding fountain solution and/or ink to the plate precursor.

18. The method of claim 17, wherein during step (b) the plate precursor is heated for 1 to 10 minutes at a temperature from 120° C. to 200° C. and the image recording layer has a daylight stability after the heating step (b) of at least 30000 lux·min.

\* \* \* \* \*